US012184306B2

(12) United States Patent
Iqbal et al.

(10) Patent No.: US 12,184,306 B2
(45) Date of Patent: Dec. 31, 2024

(54) POLAR CODER FOR CHANNEL ENCODING CHAIN FOR WIRELESS COMMUNICATIONS

(71) Applicant: Analog Devices International Unlimited Company, Limerick (IE)

(72) Inventors: Shajeel Iqbal, Birkerod (DK); Anders Lund, Vekso Sjaelland (DK)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 18/353,538

(22) Filed: Jul. 17, 2023

(65) Prior Publication Data
US 2024/0022264 A1 Jan. 18, 2024

Related U.S. Application Data

(60) Provisional application No. 63/368,539, filed on Jul. 15, 2022, provisional application No. 63/368,540, (Continued)

(51) Int. Cl.
*H03M 13/13* (2006.01)
*H03M 13/27* (2006.01)
(Continued)

(52) U.S. Cl.
CPC .......... *H03M 13/13* (2013.01); *H03M 13/27* (2013.01); *H04L 1/0041* (2013.01);
(Continued)

(58) Field of Classification Search
CPC ...... H03M 13/13; H03M 13/27; H03M 13/09; H03M 13/635; H04L 1/0041; H04L 1/0057; H04L 1/0071; H04W 28/04
See application file for complete search history.

(56) References Cited

U.S. PATENT DOCUMENTS

2018/0242200 A1  8/2018 Levy
2020/0092040 A1  3/2020 Huang et al.
(Continued)

FOREIGN PATENT DOCUMENTS

CN  101510781 A  8/2009

OTHER PUBLICATIONS

X. Wu, Y. Wang and C. Li, "Low-Complexity CRC Aided Joint Iterative Detection and SCL Decoding Receiver of Polar Coded SCMA System," in IEEE Access, vol. 8, pp. 220108-220120, 2020 (Year: 2020).*

(Continued)

*Primary Examiner* — Cynthia Britt
(74) *Attorney, Agent, or Firm* — ARENTFOX SCHIFF LLP

(57) ABSTRACT

Example implementations include a method, apparatus and computer-readable medium of wireless communications, comprising receiving an input data sequence of a set of bits, wherein the input data sequence includes at least a portion of a set of CRC interleaved information bits, and wherein a number of the set of bits is at least 32. The implementations further include encoding the input data sequence by a polar encoder to define an intermediate polar encoded data sequence, the polar encoder having a combinational circuit including a plurality of stages that operate in a same clock cycle. Additionally, the implementations further include encoding the intermediate polar encoded data sequence for each of the plurality of stages according to a polar encoder factor graph to obtain a final polar encoded data sequence. Additionally, the implementations further include transmitting a polar encoded codeword on a control channel based on the final polar encoded data sequence.

17 Claims, 19 Drawing Sheets

Related U.S. Application Data filed on Jul. 15, 2022, provisional application No. 63/368,541, filed on Jul. 15, 2022.

(51) Int. Cl.
*H04L 1/00* (2006.01)
*H04W 28/04* (2009.01)

(52) U.S. Cl.
CPC .......... *H04L 1/0057* (2013.01); *H04L 1/0071* (2013.01); *H04W 28/04* (2013.01)

(56) References Cited

U.S. PATENT DOCUMENTS

2021/0306005 A1* 9/2021 Sheiman ............... H03M 13/13
2024/0022351 A1* 1/2024 Iqbal .................... H03M 13/635
2024/0031061 A1* 1/2024 Iqbal .................... H03M 13/13

OTHER PUBLICATIONS

International Search Report and Written Opinion in PCT/EP2023/069841, mailed Dec. 11, 2023, 22 pages.
Invitation to Pay Fees in PCT/EP2023/069841, mailed Oct. 20, 2023, 15 pages.
3rd Generation Partnership Project; Technical Specification Group Radio Access Network; NR; Multiplexing and Channel Coding, Release 15, V15.6.0, 3GPP Standard TS 38.212, Jun. 2019, Retrieved from the Internet: <URL: https://www.3gpp.org/ftp/Specs/archive/38_series/38.212/>, pp. 1-101.
Kaykac Egilmez et al., "The Development, Operation and Performance of the 5G Polar Codes," IEEE Communications Surveys Tutorials, 2020, Retrieved from the Internet: <URL:https://ieeexplore.ieee.org/document/8936409/>, vol. 22, No. 1, pp. 96-122.
Shih et al., "High-speed low-area-cost VLSI design of polar codes encoder architecture using radix-k processing engines," IEEE 5th Global Conference on Consumer Electronics, 2016, Retrieved from the Internet: <URL:https://ieeexplore.ieee.org/abstract/document/7800526/>, pp. 1-2.
Yoo et al., "Partially Parallel Encoder Architecture for Long Polar Codes," IEEE Transactions on Circuits and Systems II: Express Briefs, Mar. 2015, Retrieved from the Internet: <URL: https://ieeexplore.ieee.org/document/6951410/>, vol. 62, No. 3, pp. 306-310.
Zhang et al., "Pipelined implementations of polar encoder and feed-back part for SC polar decoder," International Symposium on Circuits and Systems (ISCAS), 2015, Retrieved from the Internet: <URL:https://ieeexplore.ieee.org/document/7169326/> pp. 3032-3035.

\* cited by examiner

```
// calculations of RAM addresses for current stage, butterfly and group
always_comb begin
   ram0_addr_temp =  grp_cnt << stg_cnt ;
   ram1_addr_temp =  grp_cnt << stg_cnt ;
   for( int i=1; i < 7; i=i+1 ) begin
     if ( stg_cnt > 0 ) begin
       ram0_addr_temp[0] = btf_cnt[0];
       ram1_addr_temp[0] = ~btf_cnt[0];
     end
     if ( i < stg_cnt ) begin
       ram0_addr_temp[i] = btf_cnt[i]^ram0_addr_temp[i-1];
       ram1_addr_temp[i] = ~( btf_cnt[i]^ram0_addr_temp[i-1] );
       //$display("i stg_cnt ram0_addr_temp[i] btf_cnt btf_cnt[i] btf_cnt[i-1]
     end
   end
end
```

POLAR CODER FOR CHANNEL ENCODING CHAIN FOR WIRELESS COMMUNICATIONS

CROSS-REFERENCE TO RELATED APPLICATIONS

The present document claims priority to U.S. Provisional Patent Application Ser. No. 63/368,541 which was filed on Jul. 15, 2022, U.S. Provisional Patent Application Ser. No. 63/63/368,540 which was filed on Jul. 15, 2022, and U.S. Provisional Patent Application Ser. No. 63/368,539 which was filed on Jul. 15, 2022. The contents of the U.S. Provisional Patent Applications are incorporated herein in their entirety.

TECHNICAL FIELD

The present disclosure generally relates to wireless communication systems and devices, and, more particularly, to cyclic redundancy check (CRC) interleavers, polar encoders, and rate matchers in an encoding chain of a device for wireless communications.

BACKGROUND

Systems used for wireless communication, such as Long Term Evolution (LTE) and $5^{th}$ generation (5G) new radio (NR), and systems used for cable communication, such as cable television networks, are radio systems that transmit and receive signals in the form of electromagnetic waves in the radio frequency (RF) range of approximately 3 kiloHertz (kHz) to 300 gigaHertz (GHz).

Recent years have seen tremendous growth in the demand for high data rates fueled, for example, by high-speed Internet applications and large-scale implementations of Internet of Things (IoT) devices. To fulfill this demand, 3rd generation partnership project (3GPP) has developed the specification for the 5G new radio (5G NR). The 5G NR supports enhanced mobile broad band, ultra-reliable low latency communication, and massive machine type communication services. These services set stringent requirements on the entire data chain for throughput and latency. For example, a peak throughput of 20 Gb/s and latency of 0.5 ms are targeted.

Thus, improvements in wireless communications are desired.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

An example aspect includes a method of wireless communications, comprising receiving, at a cyclic redundance check (CRC) interleaver, a set of information bits in a message register. The method further includes receiving a set of valid bits in a mask register. Additionally, the method further includes dividing the set of interleaved message bits and the set of interleaved mask bits into respective ones of a set of bit groups each with a same number of interleaved message bits and interleaved mask bits such that each set of bit groups includes a set of divided interleaved message bit groups and a set of divided interleaved mask bit groups. Additionally, the method further includes selecting valid bits from the set of divided interleaved message bit groups based on the set of divided interleaved mask bit groups for each of the set of bit groups. Additionally, the method further includes combining the valid bits to obtain a set of CRC interleaved information bits. Additionally, the method further includes transmitting a polar encoded codeword on a control channel based on the set of CRC interleaved information bits.

Another example aspect includes an apparatus for wireless communications, comprising one or more memories and one or more processors coupled with the one or more memories and configured, individually or in combination, to perform the following actions. The one or more processors are configured to receive, at a cyclic redundance check (CRC) interleaver, a set of information bits in a message register. The one or more processors are further configured to receive a set of valid bits in a mask register. Additionally, the one or more processors are further configured to divide the set of interleaved message bits and the set of interleaved mask bits into respective ones of a set of bit groups each with a same number of interleaved message bits and interleaved mask bits such that each set of bit groups includes a set of divided interleaved message bit groups and a set of divided interleaved mask bit groups. Additionally, the one or more processors are further configured to select valid bits from the set of divided interleaved message bit groups based on the set of divided interleaved mask bit groups for each of the set of bit groups. Additionally, the one or more processors are further configured to combine the valid bits to obtain a set of CRC interleaved information bits. Additionally, the one or more processors are further configured to transmit a polar encoded codeword on a control channel based on the set of CRC interleaved information bits.

Another example aspect includes an apparatus for wireless communications, comprising means for receiving, at a cyclic redundance check (CRC) interleaver, a set of information bits in a message register. The apparatus further includes means for receiving a set of valid bits in a mask register. Additionally, the apparatus further includes means for dividing the set of interleaved message bits and the set of interleaved mask bits into respective ones of a set of bit groups each with a same number of interleaved message bits and interleaved mask bits such that each set of bit groups includes a set of divided interleaved message bit groups and a set of divided interleaved mask bit groups. Additionally, the apparatus further includes means for selecting valid bits from the set of divided interleaved message bit groups based on the set of divided interleaved mask bit groups for each of the set of bit groups. Additionally, the apparatus further includes means for combining the valid bits to obtain a set of CRC interleaved information bits. Additionally, the apparatus further includes means for transmitting a polar encoded codeword on a control channel based on the set of CRC interleaved information bits.

Another example aspect includes a computer-readable medium comprising stored instructions for wireless communications, wherein the instructions are executable by one or more processors to receive, at a cyclic redundance check (CRC) interleaver, a set of information bits in a message register. The instructions are further executable to receive a set of valid bits in a mask register. Additionally, the instructions are further executable to divide the set of interleaved message bits and the set of interleaved mask bits into respective ones of a set of bit groups each with a same number of interleaved message bits and interleaved mask bits such that each set of bit groups includes a set of divided interleaved message bit groups and a set of divided interleaved mask bit groups. Additionally, the instructions are further executable to select valid bits from the set of divided interleaved message bit groups based on the set of divided interleaved mask bit groups for each of the set of bit groups. Additionally, the instructions are further executable to combine the valid bits to obtain a set of CRC interleaved information bits. Additionally, the instructions are further executable to transmit a polar encoded codeword on a control channel based on the set of CRC interleaved information bits.

NOM An example aspect includes a method of wireless communications, comprising receiving an input data sequence of a set of bits, wherein the input data sequence includes at least a portion of a set of CRC interleaved information bits, and wherein a number of the set of bits is at least 32. The method further includes encoding the input data sequence by a polar encoder to define an intermediate polar encoded data sequence, the polar encoder having a combinational circuit including a plurality of stages that operate in a same clock cycle. Additionally, the method further includes encoding the intermediate polar encoded data sequence for each of the plurality of stages according to a polar encoder factor graph to obtain a final polar encoded data sequence. Additionally, the method further includes transmitting a polar encoded codeword on a control channel based on the final polar encoded data sequence.

Another example aspect includes an apparatus for wireless communications, comprising one or more memories and one or more processors coupled with the one or more memories and configured, individually or in combination, to perform the following actions. The one or more processors are configured to receive an input data sequence of a set of bits, wherein the input data sequence includes at least a portion of a set of CRC interleaved information bits, and wherein a number of the set of bits is at least 32. The one or more processors are further configured to encode the input data sequence by a polar encoder to define an intermediate polar encoded data sequence, the polar encoder having a combinational circuit including a plurality of stages that operate in a same clock cycle. Additionally, the one or more processors are further configured to encode the intermediate polar encoded data sequence for each of the plurality of stages according to a polar encoder factor graph to obtain a final polar encoded data sequence. Additionally, the one or more processors are further configured to transmit a polar encoded codeword on a control channel based on the final polar encoded data sequence.

Another example aspect includes an apparatus for wireless communications, comprising means for receiving an input data sequence of a set of bits, wherein the input data sequence includes at least a portion of a set of CRC interleaved information bits, and wherein a number of the set of bits is at least 32. The apparatus further includes means for encoding the input data sequence by a polar encoder to define an intermediate polar encoded data sequence, the polar encoder having a combinational circuit including a plurality of stages that operate in a same clock cycle. Additionally, the apparatus further includes means for encoding the intermediate polar encoded data sequence for each of the plurality of stages according to a polar encoder factor graph to obtain a final polar encoded data sequence. Additionally, the apparatus further includes means for transmitting a polar encoded codeword on a control channel based on the final polar encoded data sequence.

Another example aspect includes a computer-readable medium comprising stored instructions for wireless communications, wherein the instructions are executable by one or more processors to receive an input data sequence of a set of bits, wherein the input data sequence includes at least a portion of a set of CRC interleaved information bits, and wherein a number of the set of bits is at least 32. The instructions are further executable to encode the input data sequence by a polar encoder to define an intermediate polar encoded data sequence, the polar encoder having a combinational circuit including a plurality of stages that operate in a same clock cycle. Additionally, the instructions are further executable to encode the intermediate polar encoded data sequence for each of the plurality of stages according to a polar encoder factor graph to obtain a final polar encoded data sequence. Additionally, the instructions are further executable to transmit a polar encoded codeword on a control channel based on the final polar encoded data sequence.

An example aspect includes a method of wireless communications, comprising receiving a polar encoded data sequence including a plurality of bits. The method further includes dividing the polar encoded bit sequence into a number of bit groups each including a group-specific number of bits, wherein each of the number of bit groups has a non-overlapping interleaving mapping from an initial bit address to an interleaved bit address. Additionally, the method further includes calculating the interleaved bit address for each bit of the plurality of bits in the polar encoded bit sequence based on the number of bit groups and the group-specific number of bits in each bit group. Additionally, the method further includes interleaving the number of bit groups according to the interleaved bit address for each bit of the plurality of bits in the polar encoded bit sequence to generate an interleaved bit sequence. Additionally, the method further includes adjusting the interleaved bit sequence to match a payload allocation in resource elements of a downlink control information to obtain a rate matched bit sequence. Additionally, the method further includes transmitting a polar encoded codeword on a control channel based on the rate matched bit sequence.

Another example aspect includes an apparatus for wireless communications, comprising one or more memories and one or more processors coupled with the one or more memories and configured, individually or in combination, to perform the following actions. The one or more processors are configured to receive a polar encoded data sequence including a plurality of bits. The one or more processors are further configured to divide the polar encoded bit sequence into a number of bit groups each including a group-specific number of bits, wherein each of the number of bit groups has a non-overlapping interleaving mapping from an initial bit address to an interleaved bit address. Additionally, the one or more processors are further configured to calculate the interleaved bit address for each bit of the plurality of bits in the polar encoded bit sequence based on the number of bit groups and the group-specific number of bits in each bit group. Additionally, the one or more processors are further configured to interleave the number of bit groups according to the interleaved bit address for each bit of the plurality of bits in the polar encoded bit sequence to generate an interleaved bit sequence. Additionally, the one or more processors are further configured to adjust the interleaved bit sequence to match a payload allocation in resource elements of a downlink control information to obtain a rate matched bit sequence. Additionally, the one or more processors are further configured to transmit a polar encoded codeword on a control channel based on the rate matched bit sequence.

Another example aspect includes an apparatus for wireless communications, comprising means for receiving a polar encoded data sequence including a plurality of bits. The apparatus further includes means for dividing the polar encoded bit sequence into a number of bit groups each including a group-specific number of bits, wherein each of the number of bit groups has a non-overlapping interleaving mapping from an initial bit address to an interleaved bit address. Additionally, the apparatus further includes means for calculating the interleaved bit address for each bit of the plurality of bits in the polar encoded bit sequence based on the number of bit groups and the group-specific number of bits in each bit group. Additionally, the apparatus further includes means for interleaving the number of bit groups according to the interleaved bit address for each bit of the plurality of bits in the polar encoded bit sequence to generate an interleaved bit sequence. Additionally, the apparatus further includes means for adjusting the interleaved bit sequence to match a payload allocation in resource elements of a downlink control information to obtain a rate matched bit sequence. Additionally, the apparatus further includes means for transmitting a polar encoded codeword on a control channel based on the rate matched bit sequence.

Another example aspect includes a computer-readable medium comprising stored instructions for wireless communications, wherein the instructions are executable by one or more processors to receive a polar encoded data sequence including a plurality of bits. The instructions are further executable to divide the polar encoded bit sequence into a number of bit groups each including a group-specific number of bits, wherein each of the number of bit groups has a non-overlapping interleaving mapping from an initial bit address to an interleaved bit address. Additionally, the instructions are further executable to calculate the interleaved bit address for each bit of the plurality of bits in the polar encoded bit sequence based on the number of bit groups and the group-specific number of bits in each bit group. Additionally, the instructions are further executable to interleave the number of bit groups according to the interleaved bit address for each bit of the plurality of bits in the polar encoded bit sequence to generate an interleaved bit sequence. Additionally, the instructions are further executable to adjust the interleaved bit sequence to match a payload allocation in resource elements of a downlink control information to obtain a rate matched bit sequence. Additionally, the instructions are further executable to transmit a polar encoded codeword on a control channel based on the rate matched bit sequence.

To the accomplishment of the foregoing and related ends, the one or more aspects comprise the features hereinafter fully described and particularly pointed out in the claims. The following description and the annexed drawings set forth in detail illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 8C is a diagram illustrating an example of a code for calculating RAM addresses during polar encoding, according to some aspects of the present disclosure;

DETAILED DESCRIPTION

The systems, methods, devices, and computer-readable media of this disclosure each have several innovative aspects, no single one of which is solely responsible for all of the desirable attributes disclosed herein. Details of one or more implementations of the subject matter described in this specification are set forth in the description below and the accompanying drawings.

To achieve high throughput and low latency in a wireless communication system, massive multiple-input multiple-output (MIMO) and cloud radio access networks (CRANs) are two promising approaches adopted for 5G NR, while reducing the costs of large-scale deployed base stations (BSs) and remote radio heads (RRHs). While these approaches are promising, additional improvements are desired.

The present disclosure includes a flexible and parallelizable hardware architecture of a channel encoding chain for wireless communications, such as but not limited to the fifth generation New Radio (5G NR), and such as for transmitting data on a channel, including a control channel, such as but not limited to a Physical Downlink Control Channel (PDCCH). The described hardware architecture includes a polar encoder, which may be implemented, for example, as part of the channel encoding chain in the PDCCH. The polar encoder architecture is based on the radix-k processing and fast Fourier transform (FFT) concepts. The described aspects also introduce a hardware architectures for a cyclic redundancy check (CRC) interleaver, and also for a rate matcher, each of which may be used separately or in any combination, along with the polar encoder, in channel encoding applications, such as for 5G NR PDCCH. For example, in one implementation, the described aspects may be synthesized as a complete channel encoding chain on a Virtex Ultrascale+ field-programmable gate-array (FPGA). In one non-limiting implementation, the proposed architecture may provide an output throughput of 4.26 Gbps, which can be realized while consuming as little as 3% of FPGAs resources. In one non-limiting example, the proposed polar encoding architecture can be applied to highly dense 5G NR fronthaul links supporting, in one non-limiting example, from 87 to up to 164 antenna layers. The systems, methods, devices, and computer-readable media of this disclosure, including in one non-limiting example the channel encoding architecture for PDCCH, allows high-throughput encoding with small hardware complexity, and therefore one or more of the described aspects can be systematically applied to various other scenarios being considered for 5G NR or other wireless communication technologies.

Figure 1:
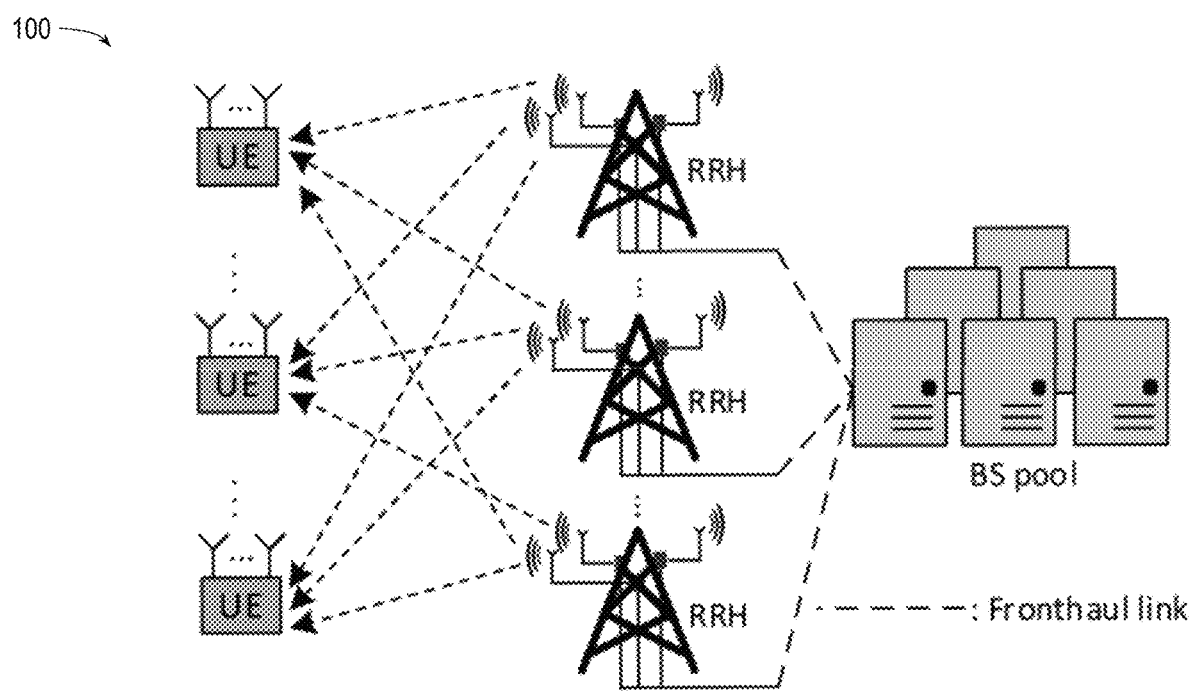
FIG. 1 is a schematic block diagram illustrating an example of a cloud radio access network (CRAN) system.

FIG. 1 is a schematic block diagram illustrating an example of a cloud radio access network (CRAN) system 100. The system 100 may include ultra-dense deployed low-power RRHs with a few antennas. The RRHs may serve user equipment (UE) that are close to the RRHs. Each RRH may include the radio functions and is located close to the antennas in the cell site tower, where the BS may include all baseband processing functions (including channel coding as described herein). In some aspects, a plurality of BSs may be grouped in a BS pool. Each RRH and BS pair are connected using a network segment including fronthaul links of a fronthaul network as shown in FIG. 1. The fronthaul network facilitates the transmission of baseband signal with a high load that may be transmitted over the fronthaul links, which can become a bottleneck even if a high-speed fiber optic cable is deployed.

To facilitate the high traffic demand of fronthaul networks, the channel coding schemes have been developed to provide increased reliability and throughput. For example, in 5G, low-density parity-check (LDPC) codes have been adopted for the use of physical data channels such as the physical download shared channel (PDSCH). To use the physical data channels such as the PDSCH, it may be desirable to guarantee a successful transmission of control information via the physical downlink control channel (PDCCH). Polar codes may be used in 5G PDCCH for the successful transmission of control information.

Polar codes may generally perform better than convolutional codes, employed in long term evolution (LTE), for smaller payload sizes of 250 bits or less, which is enough for the maximum payload size of the control information in 5G NR PDCCH.

The present disclosure includes improvements on the chain of the components of channel encoding, e.g., polar encoding, cyclic redundancy check (CRC) scrambling and interleaving, frozen bits insertion, and rate matching.

Accordingly, in one aspect, the present disclosure provides techniques for implementing an efficient CRC interleaver (e.g., a CRC interleaver circuit arrangement), for example, for use with polar codes. In an aspect, a CRC interleaver may include a message register, a mask register, a first interleaver (e.g., with an interleaver pattern derived from a 164-bit mother pattern), a second interleaver the same as the first interleaver, a plurality of valid bit search block, and a combiner. The message register may be assigned with K information bits (e.g., including a PDCCH downlink control information (DCI) payload and CRC) and prepended with (164-K) NULL bits (e.g., zeros). The mask register may be initialized with K valid bits (e.g., ones) and prepended with (164-K) NULL bits. The first interleaver may interleave the bits in the message register using the mother interleave pattern. The mother interleave pattern may be stored in a register (e.g., a 164-bit register). The second interleaver may interleave the bits in the mask register using the same mother interleave pattern. The output (e.g., interleaved information bits) of the first interleaver may be divided into L plurality of blocks of M bits each (e.g., L=32 and M=5). Similarly, the output (e.g., interleaved mask bits) of the second interleaver may be divided into L plurality of blocks of M bits each. The valid bits search block may include a multiplexer (MUX) to select valid bits from the input bits (e.g., the interleaved information bits) based on the mask bits. In some aspects, the valid bits search blocks may perform processing in parallel. The combiner may combine the outputs of the valid bits search blocks.

The systems, schemes, and mechanisms described herein advantageously provide an efficient CRC interleaver. For example, for a code length of 1024 bits, the disclosed CRC interleaver may provide a throughput of 4-5 Gbps and may utilize less than 1% of total hardware resources used for PDCCH channel encoding. The disclosed CRC interleaving scheme may be implemented using any suitable field-programmable gate array (FPGA) and/or process technology. Further, while the disclosed aspects are discussed in the context of 5G PDCCH channel encoding, the disclosed CRC interleaving techniques may be applied to any suitable wireless communication technology or wireless communication standard.

In another aspect, which may be separate from or combined with the CRC interleaver aspects, the present disclosure provides techniques for implementing an efficient polar coder (e.g., a polar encoding circuit arrangement) including polar encoding and frozen bit insertion. In an aspect, a polar encoder may include a radix-k (e.g., k=32) polar encoding processing block and one or more polar encoding stages.

The polar encoder may also include a memory block in which outputs of the radix-k polar encoding processing block may be stored. The polar encoder may further include a control unit implementing a finite state machine to control accesses to the memory block for processing by one or more subsequent polar encoding stages.

The systems, schemes, and mechanisms described herein advantageously provide a polar encoder with a high codeword throughput, a low latency, and a low hardware resource utilization. For example, for a code length of 1024 bits, the disclosed polar encoder may provide up to 4-5 Gb/s codeword throughput and may utilize less than 3-4% of total hardware resources used for PDCCH channel encoding. The disclosed polar encoding scheme may be implemented using any suitable field-programmable gate array (FPGA) and/or process technology. Further, while the disclosed aspects are discussed in the context of 5G PDCCH channel encoding, the disclosed polar encoding techniques may be applied to any suitable wireless communication technology or wireless communication standard.

In yet another aspect, which may be separate from or combined with the CRC interleaver aspects and/or the polar coder aspects, the present disclosure provides techniques for implementing an efficient parallelized rate macher (e.g., a rate matcher circuit arrangement), for example, for use with polar codes. In an aspect, a rate matcher may include a sub-block interleaver and a bit selection block. The sub-block interleaver may partition a bit sequence into a plurality of bit groups and perform interleaving within each bit group. The sub-block interleaver may calculate the address for each bit in the sequence based on a number of sub-block interleaving groups and a number of bits in each sub-block interleaving group. After the bit addresses are calculated, interleaving may be performed for each bit group. In some aspects, the bit address calculation may for each group may be calculated in parallel. The bit selection block may perform repetition, puncturing, or shortening to adjust the code block length (e.g., based on allocated radio resources).

The systems, schemes, and mechanisms described herein advantageously provide a parallelized rate matcher with a high output throughput, a low latency, and a low hardware resource utilization. For example, for a code length (N) of 1024 bits, the disclosed rate matcher may provide an output throughput of about 12-13 Gbps. The disclosed rate matching scheme may be implemented using any suitable field-programmable gate array (FPGA) and/or process technology. Further, while the disclosed aspects are discussed in the context of 5G PDCCH channel encoding, the disclosed rate matching techniques may be applied to any suitable wireless communication technology or wireless communication standard.

Figure 2:
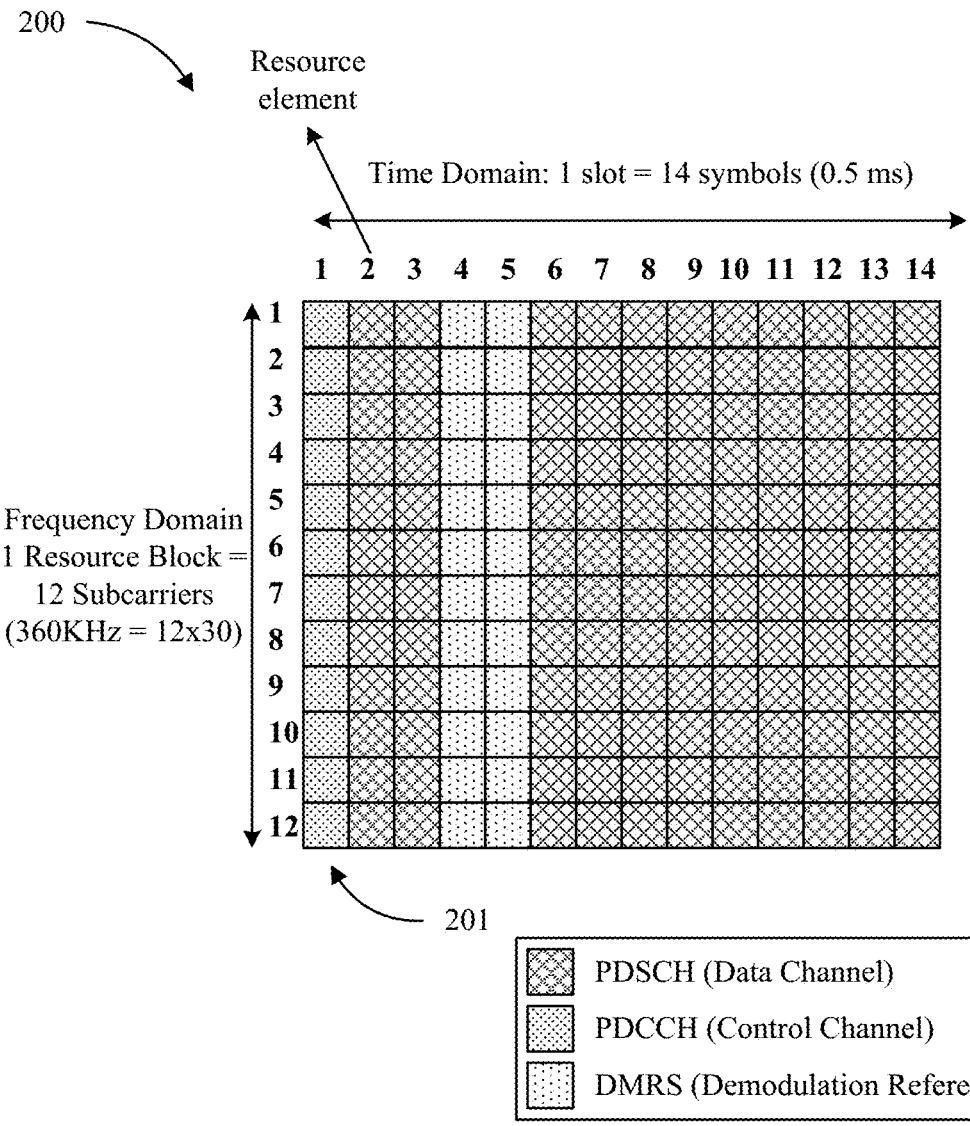
FIG. 2 is a schematic block diagram illustrating an example of a resource element block for wireless communication.

FIG. 2 is a schematic block diagram illustrating an example of a resource element block 200 for wireless communication. The resource element block 200 may be suitable for use in NR frame structure. For example, as described in the 3GPP NR standard, each radio frame has a length of 10 ms and is divided into ten subframes of 1 ms in duration. Each subframe may include symbols, as illustrated in FIG. 2.

A resource element is the smallest unit of the resource block including one subcarrier for one symbol interval. A physical resource block is the smallest unit of resources that can be allocated to a user, which may include 12 subcarriers. For a subcarrier spacing of 30 kHz, the resource block is 360 kHz wide in frequency. A resource element group (REG) may include 12 resource elements in the frequency domain and one symbol in the time domain. Moreover, multiple continuous REGs constitute a control channel element for carrying downlink control information (DCI). In the illustrated example of FIG. 2, DCI is carried by one symbol (shown by 201), which is equivalent to 12 resource elements. The DCI uses quadrature phase shift keying (QPSK) modulation and carries information about PDSCH channel resource allocation. In some instances, the maximum number of information bits carried by one QPSK modulated symbol of PDCCH may be about 1.3262 bits. Thus, the total number of bits in one resource block of PDCCH over one slot may be 12×1.3262=15.9144 bits. In some instances, a 100 MHz bandwidth with a kHz subcarrier spacing may include 273 resource blocks. This means it occupies 273*12*30=98.28 MHz, and the rest of the bandwidth may be used for guard band. The total number of slots in one second may be 1000 ms/0.5 ms=2000 slots. The total number of bits per second (throughput) carried by DCI for one PDCCH symbol with 100 MHz may be as shown below:

$$\text{Throughput} = \# \text{ bits} \times \# RBs \times \# \text{ slots} \times \# \text{ antennas} \quad (1)$$

$$= 15.9144 \times 273 \times 2000 \times 1$$

$$= 8.689 \text{ Mbps},$$

In 5G NR, the number of resource elements is dynamically assigned to the DCI and thus it is difficult to estimate maximum throughput requirement for PDCCH. But there will be 3 symbols assigned to the DCI payload, which correspond to throughput of 26 Mbps, according to Eq. 1 for one antenna.

The DCI provides the uplink or downlink data channel with scheduling information, as well as additional control information for a single UE or a group of UEs (in the system 100 of FIG. 1). The generation of PDCCH from DCI is discussed below with reference to FIG. 3.

Figure 3:
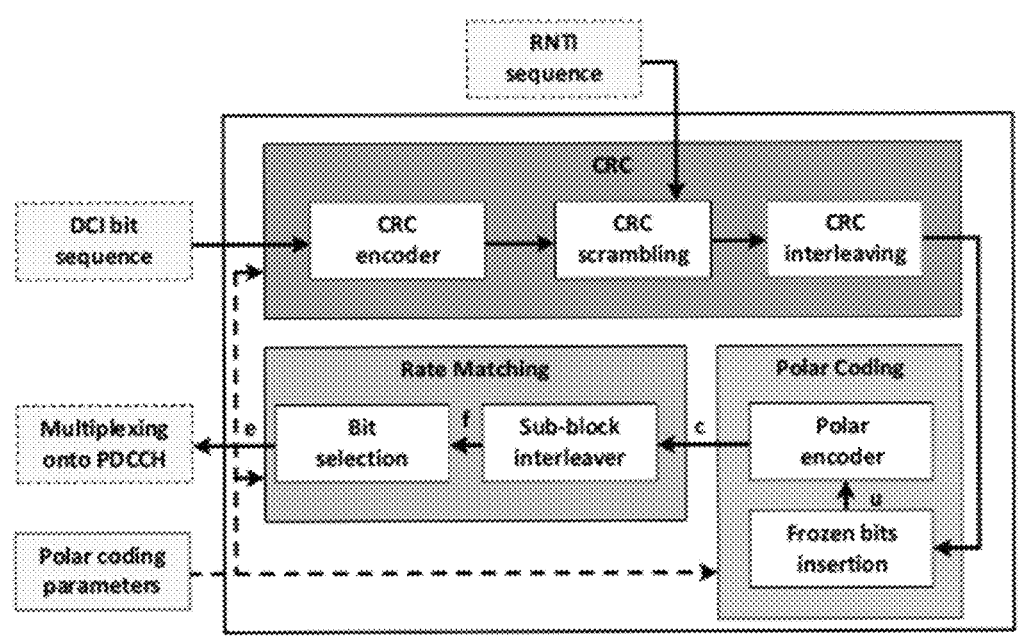
FIG. 3 is a schematic block diagram illustrating an example of a channel encoder chain.

FIG. 3 is a schematic block diagram illustrating an example of a channel encoder 300. The channel encoder 300 shown in FIG. 3 may be used to generate PDCCH from DCI. The channel encoder may include a CRC block, a polar encoding block, and a rate matching block. The CRC block may include a CRC encoder block, a CRC scrambler block, and a CRC interleaver block. The polar coding block may include a polar encoder block and a frozen bits insertion block. The rate matching block may include a sub-block interleaver and a bit selection.

Regarding the CRC block, in an example, if the size of the DCI format is less than 12 bits, a few zero-padding bits are attached to the DCI payload to form a payload size of at least 12 bits. Based on DCI payload bits, the CRC encoder calculates a 24-bit CRC check and attaches it to the DCI payload. The CRC allows the UE to not only detect errors in the decoded payload bits, but also to help the UE in eliminating the decoding paths that fail the CRC checks during the error correction process. In some implementations, the CRC scrambling block scrambles the last 16 CRC bits with the radio network temporary identifier (RNTI), for example, by XOR'ing CRC bits with RNTI bits.

Regarding CRC interleaving, the CRC bits are then distributed among the information bits by interleaving them, thereby outputting a set of CRC interleaved information bits. In some instances, the CRC interleaver block may support a maximum length of 164 bits. This means that the DCI payload can have 140 bits without 24 bits of CRC.

The polar encoder block then encodes the CRC interleaved information bits, based on polar coding parameters and including frozen bit insertion, to protect the DCI payload from transmission errors. For instance, the information bits obtained after CRC interleaving are appended with frozen bits so that the output from frozen insertion (indicated as "u" in FIG. 3) becomes the input to the polar encoder. The encoded output, e.g., a polar encoded data sequence (indicated as "c" in FIG. 3), is then rate matched by the rate matching block, where sub-block interleaving by the sub-block interleaver (e.g., outputting an intermediate rate matched bit sequence, also referred to as an interleaved bit sequence, indicated as "f" in FIG. 3), and bit-selection by bit selection block may facilitate the payload allocation in resource elements of the DCI. Thus, for example, the output of the rate matching block, e.g., a final rate matched bit sequence (indicated as "e" in FIG. 3), may be multiplexed onto a channel, such as the PDCCH, and transmitted as a polar encoded codeword.

The following discussions may use A to represent the DCI payload, P to represent CRC bits, K to represent information bits (where K=A+P) and N to represent the polar codeword length.

Figure 4:
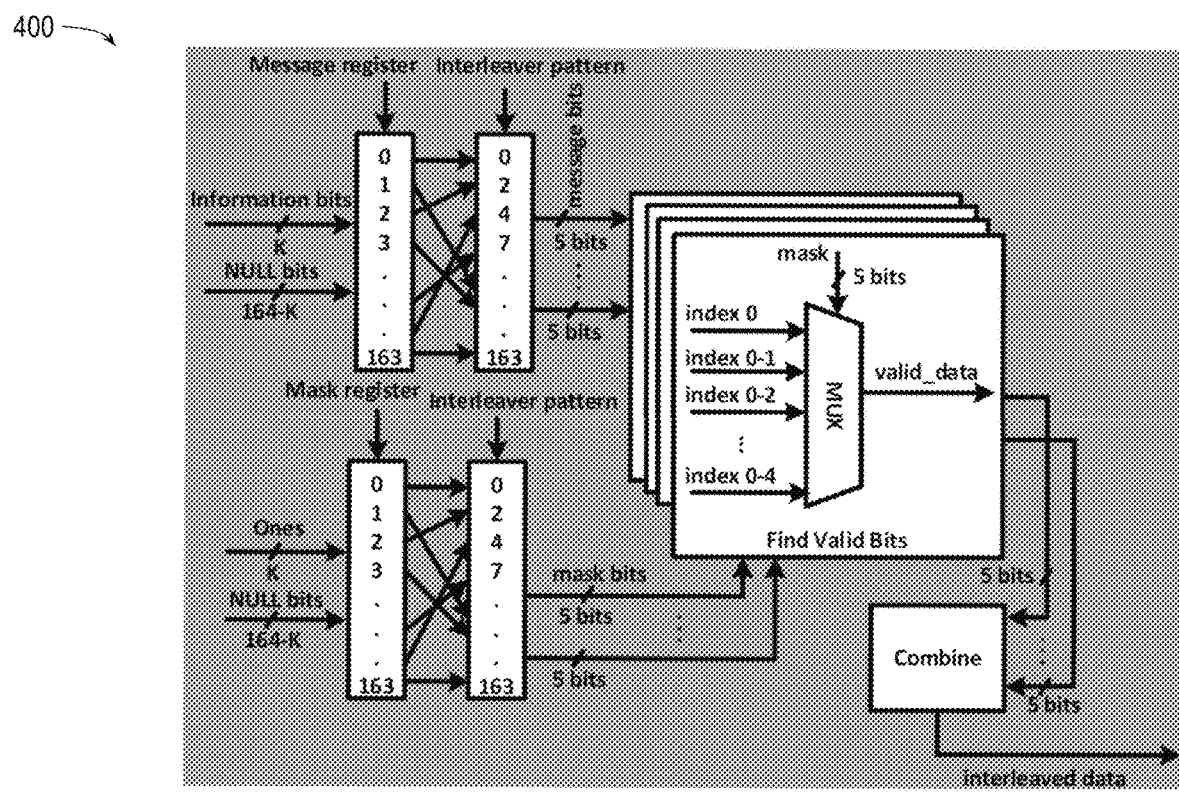
FIG. 4 is a schematic block diagram illustrating an example of a hardware architecture for a cyclic redundancy checking (CRC) interleaver, according to some aspects of the present disclosure.

FIG. 4 is a schematic block diagram illustrating an example of a hardware architecture for a CRC interleaver 400, according to some aspects of the present disclosure. In some aspects, the CRC interleaver 400 may correspond to the CRC interleaving block of FIG. 3.

For PDCCH, the DCI payload (or information bits) length may be limited to A ∈ [12, 140]. The information block is then appended with a 24-bit CRC, which makes the total information length to K=A+P=140+24=164 bits. A 164-bit interleaver mother pattern may distribute the information bits over the code block instead of attaching the CRC bits at the end of the information bit sequence. The CRC interleaver may be designed to reduce latency in the decoder by ensuring that the CRC bits rely only on the information bits that precede it in the list decoding of polar codes so that CRC checks can be carried out before the sequence is completed.

All interleaver patterns of lower value of K can be derived from the 164-bit mother pattern. One way to obtain an interleaver pattern of any size other than 164 is by pre-pending the 164-K NULL bits to the K information bits, and then interleaving is performed with the 164-bit interleaver. After interleaving, the NULL bits are removed from the sequence and the K interleaved bits are obtained.

In hardware, this can be done by creating two registers each 164 bit in length, such as a message register and a mask register as shown in FIG. 4. Message register is assigned the K information bits and is pre-pended with (164-K) NULL bits (i.e., 0's). While the mask register is initialized with K valid bits (i.e., 1's) and is pre-pended with (164-K) NULL bits (i.e., 0's). Both registers are then interleaved with the mother interleaver pattern. The mother interleaver pattern is stored in a 164-bit register.

After interleaving both registers, the indices of the mask register that include NULL values are removed from the message register to obtain the interleaved bits. This can be done in parallel by dividing the 164 bits into blocks of M bits. In the illustrated example of FIG. 4, M is 5. Thus, the 164 bits can be processed in parallel using 164/5=32 blocks. Each of these 32 blocks (referred to as Find Valid Bits in FIG. 4) take in 5 message bits and 5 mask bits as input. A multiplexer (MUX), such as a 32-bit multiplexer in this example, is used to select the valid bits from the input based on the mask bits. The mask bits act as a selector for the MUX, as shown in FIG. 4. The valid data obtained from Find Valid Bits blocks are fed to the combiner block (also referred to as a combine block). The combiner block takes in 32 blocks of 5 bits and multiplexes and concatenates them to obtain K interleaved bits.

Figure 5:
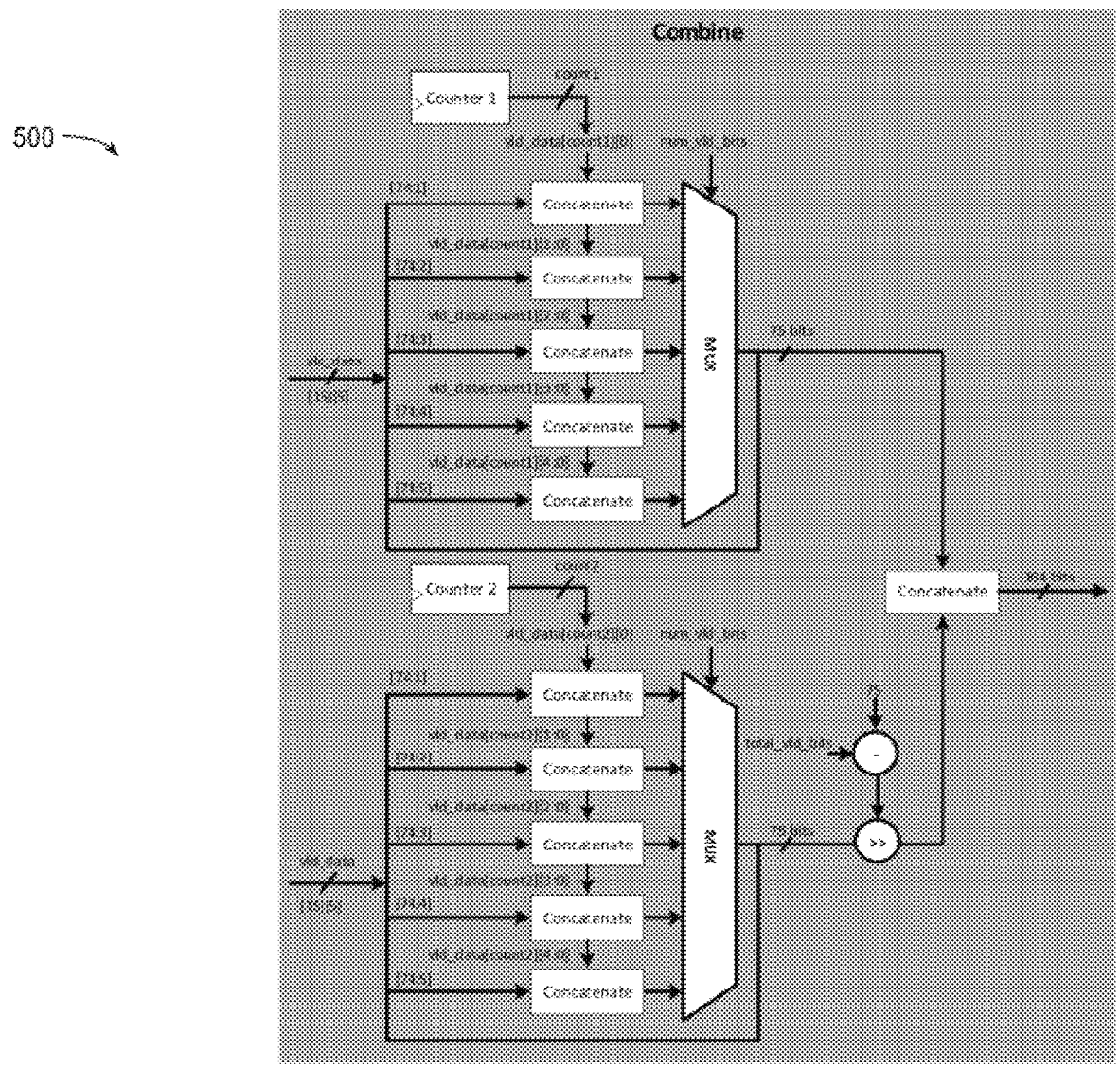
FIG. 5 is a schematic block diagram illustrating an example of a combiner block for a CRC interleaver, according to some aspects of the present disclosure.

FIG. 5 is a schematic block diagram illustrating an example of a combiner block 500 for the CRC interleaver 400 of FIG. 4, according to some aspects of the present disclosure.

The combiner block 500 receives 30 blocks of data with 5 valid bits in each of them. The 30 blocks of data may be divided into two blocks (or any suitable number of blocks, e.g., 3, 4 or more blocks) and take out the valid data separately (or in parallel) as shown in FIG. 5 to the right. The counters may indicate which data to take from the valid data input. The multiplexer (MUX) may select which of the bits are valid. The selector of the MUX is the number of valid bits in each data stream.

The valid data can be concatenated with a 75 bit data bus to collect all the data in one register. The second half of the data (shown in the bottom part of FIG. 5) may be performed using a similar mechanism. At the end, both registers of 75 bits are combined to form a 164-bit register with complete interleaved data.

While FIGS. 4 and 5 are discussed using an example with 164 mother interleaved pattern and M=5, any suitable mother interleaver length and/or any suitable value of M (e.g., 3, 4, 6 or more) may be used.

In some examples, for N=1024 and 3 symbols PDCCH DCI payload, a PDCCH encoding chain using the CRC interleaver discussed herein can support encoding up to 164 resource blocks.

Thus, in one implementation, the described aspects includes a parallelize-able masking-based version of a CRC interleaver to remove NULL bits from the 164-bit interleaver, which in an implementation can achieve a throughput of 4 Gbps while utilizing less than 1% of FPGA resources. Additional aspects include a CRC interleaver configured to combine the data in parallel fashion based on available valid data.

FIGS. 6, 7, 8A-8C, 9 and 10 are discussed in relation to each other to illustrate polar encoding, for example, performed by the polar encoder block of FIG. 3.

Figure 6:
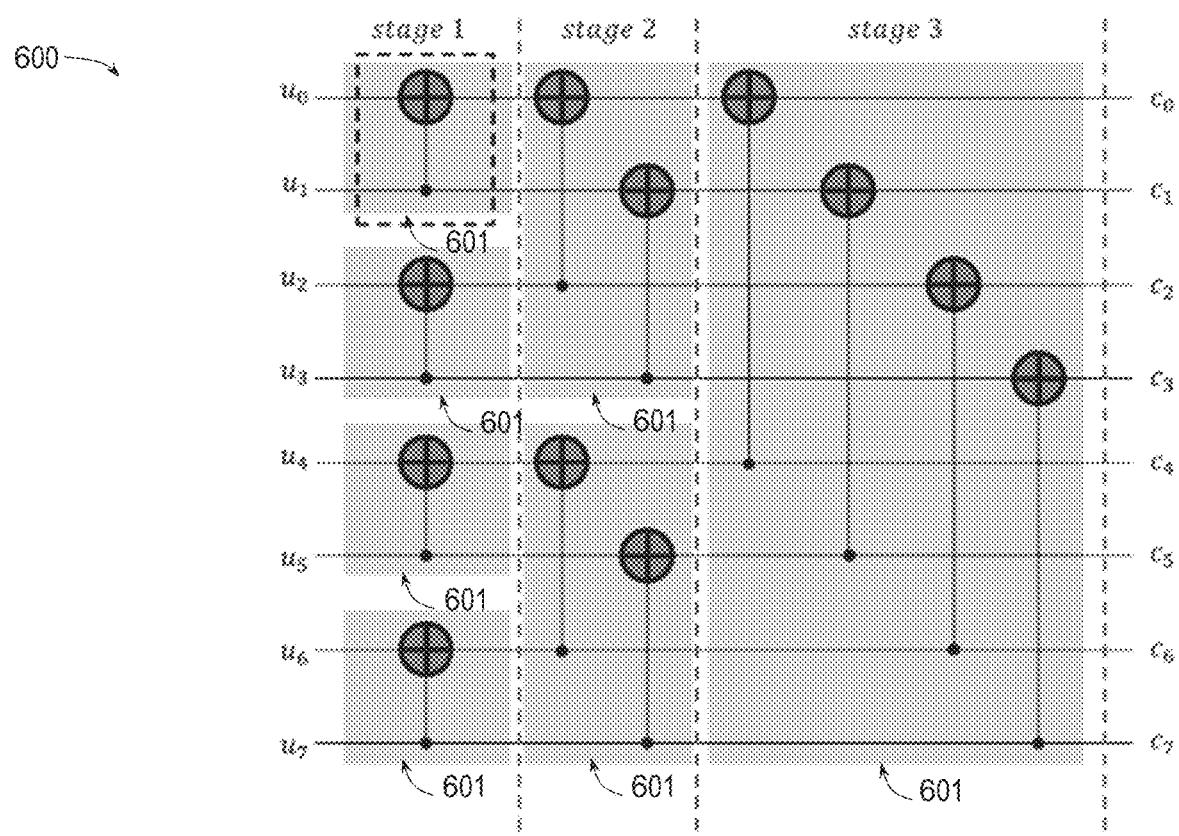
FIG. 6 is a schematic block diagram illustrating an example of a polar code factor graph representative of features of a polar encoder, according to some aspects of the present disclosure.

FIG. 6 is a schematic block diagram illustrating an example of a polar code factor graph 600, for example, corresponding to polar encoding operations at the polar encoder block of FIG. 3. Polar codes use redundancy in the form of frozen bits, which are usually set to zero, to recover the information bits at the receiver side.

For instance, after the insertion of CRC, information, and frozen bits, polar encoding can be performed. Let $\mu_0^{N-1} = [\mu_0, \mu_1, \ldots, \mu_{N-1}]$ be the vector including K=A+P binary information and CRC bits, and N−K frozen bits, then the binary codeword vector $c_0^{N-1} = [c_0, \ldots, c_{N-1}]$ for a polar code can be obtained as follows:

$$c_0^{N-1} = \mu_0^{N-1} G_N, \quad (2)$$

where $G_N$ is the polar generator matrix, defined as: $G_N = G_2^{\otimes n}$, where $n = \log_2(N)$, $\otimes$ denotes the Kronecker power product, and $$G_2 = \begin{bmatrix} 1 & 0 \\ 1 & 1 \end{bmatrix}. \quad (3)$$

In the illustrate example of FIG. 6, polar encoding represented as a factor graph for N=8 is shown. The dashed-line box represents the factor graph for $G_2$ in equation (3) and may correspond to an XOR-PASS module discussed herein.

As shown in FIG. 6, the factor graph 600 of the polar code may share similarities with FFT structure except that the polar encoder may employ the kernel matrix ($G_2$ in equation (3)) instead of the butterfly operation. In the case of polar code, the butterfly operation of FFT is an XOR and pass operation, which may be referred to as the XOR-PASS module. As for the FFT structure, the polar factor graph also has $n=\log_2(N)$ stages ($n=\log_2(8)=3$ stages for N=8 as shown in FIG. 6). Each stage may include N/2 XOR operations, which is 4 XOR operations for N=8 as shown in FIG. 6. Each stage is decomposed into smaller groups including an amount of XOR-PASS modules. The groups are outlined by boxes 401 in FIG. 6.

Let's assume that the input data bus is 2 bits, which means that at each clock cycle the polar encoder receives 2 bits to process. At the first clock cycle, we receive bits $\mu_0$ and $\mu_1$ and perform the corresponding XOR operation shown by the black dotted square in FIG. 6. The XOR operation can be performed in one clock cycle, so the output of $\mu_0$ and $\mu_1$ is available in one clock cycle. At the next clock cycle, we can process bits $\mu_2$ and $\mu_3$, and so on. Thus, it may take 4 clock cycles to complete stage 1 for N=8. If we keep processing two bits at a time, stages 2 and 3 may also take 4 clock cycles to finish. This means for N=8, encoding may take 12 clock cycles. If this process is extended to N=1024, the latency may be too high and impractical for 5G NR systems.

In some aspects, the input data bus is usually 32 bits or higher. As an example, the hardware implementation of the polar encoder of FIG. 3 may utilize a 32-bit input data bus. At the first clock cycle, when 32 bits have been received, a combinational circuit for a 32-bit polar encoder can be used to process all 32 received bits instead of instead of processing one bit at a time. The combinational circuit for this 32-bit polar encoder may include $n=\log_2(32)=5$ stages and perform encoding of these 5 stages in one clock cycle without consuming too many hardware resources. For N=128, the total number of stages are $n=\log_2(128)=7$. The first 5 stages for N=128 are performed by the 32-bit polar encoder in one clock cycle and then there are two stages left to be encoded. Such a hardware implementation of a polar encoder is referred to as radix-k processing implementation, where k is the number of bits used in processing elements (e.g., k is 2 in the dashed-line box shown in FIG. 6).

Figure 7:
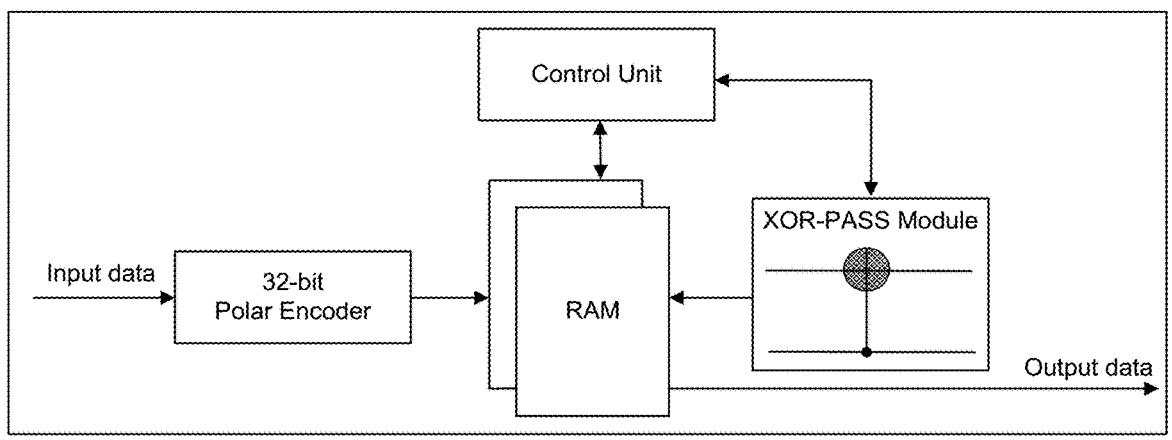
FIG. 7 is a schematic block diagram illustrating an example of a polar encoder, according to some aspects of the present disclosure.

FIG. 7 is a schematic block diagram illustrating an example of a polar encoder 700, according to some aspects of the present disclosure. The polar encoder 700 includes a 32-bit polar encoder (e.g., a radix-k polar encoder), a control unit or controller, at least one but preferably at least two random-access memory (RAM) blocks, and one or more XOR-PASS module(s).

The 32-bit input data are first encoded by a 32-bit polar encoder, which is a combinational circuit of 32-bit polar encoder based on a polar transformation matrix for N=32, i.e., $G_{32}^{\otimes 5}$. The output from the 32-bit polar encoder is written to the RAM which is used by the controller to process the rest of the stages in the polar encoder. This process can be extended to any code length N. For higher code lengths, the amount of hardware may not increase much but the time to process the stages after the first 5 stages are processed by the 32-bit polar encoder increases, which slightly increases the latency and slightly decreases the throughput of the polar encoder.

While FIG. 7 illustrates the radix-k polar encoder as a 32-bit polar encoder where k=5, aspects are not limited thereto. For instance, the polar encoder 700 may include a radix-k polar encoder where k may be any suitable integer (e.g., 4 for a 16-bit polar encoder, 6 for a 64-bit polar encoder, etc.) and one or more stages of polar encoding depending on the code length. In general, the polar encoder 700 can include suitable combination of radix-k polar encoder(s) and additional polar encoding stage(s).

Figure 8A:
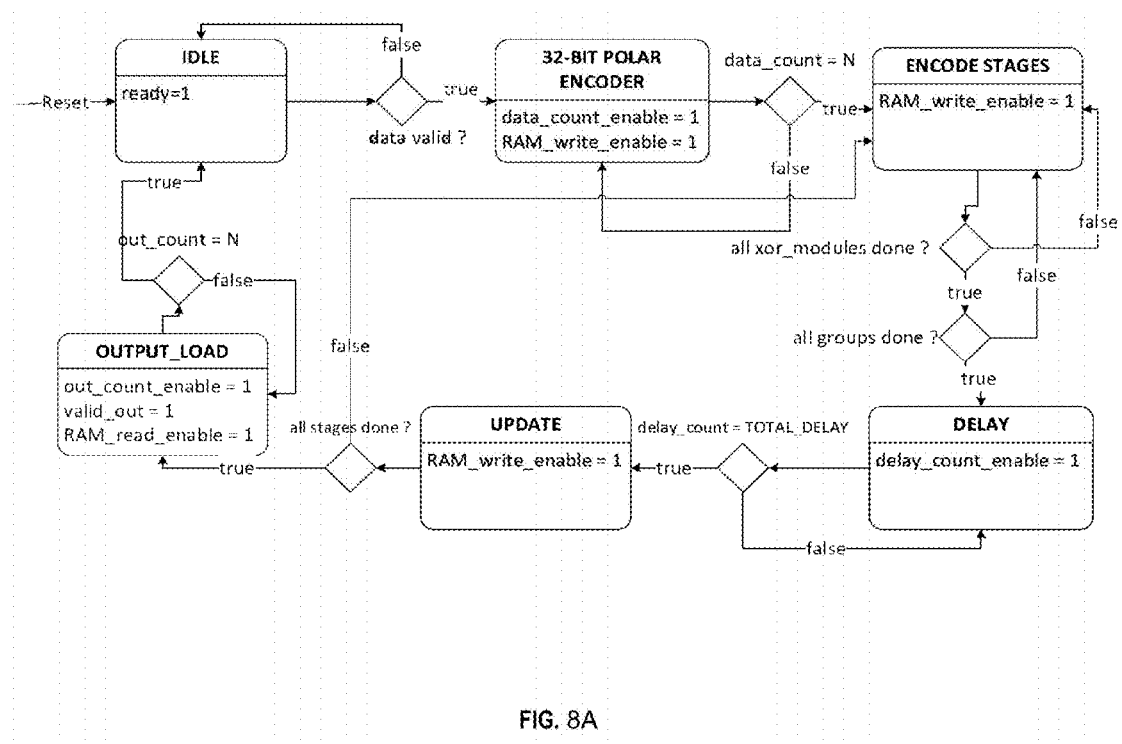
FIG. 8A is a schematic block diagram illustrating a finite state machine for a polar encoder, according to some aspects of the present disclosure.

FIG. 8A illustrates an FSM for a polar encoder, according to some aspects of the present disclosure. The polar encoder controller (the control unit of FIG. 7) may be implemented by an FSM as shown in FIG. 8A. The control unit generates all memory read and write addresses. Moreover, it keeps track of overall computations in the polar encoder including the XOR-PASS module, group, and stage count. It also helps with the loading of input data from the 32-bit polar encoder onto the RAM and delivering the encoded data to the output bus.

Once the valid signal is asserted and the input data start coming, the FSM sets the write control signal to the RAMs and starts writing the encoded data from the 32-bit polar encoder to the RAMs. The XOR-PASS module requires two inputs and two outputs. Thus, at any given time to compute XOR-PASS module, the controller may provide two input addresses from where the data may be read and two output addresses to where the data may be written. The RAM may allow one read operation or one write operation in one clock cycle. To facilitate two inputs or two outputs in one clock cycle from XOR-PASS module, two RAMs (RAM 0 and RAM 1) may be used, where input data with the odd index is written to RAM 0 and data with the even index is written to RAM 1. Once all the input data has arrived and written to RAMs, the FSM moves on to the next state (shown as ENCODE STAGES in FIG. 8A), where the encoding of the remaining stages is performed.

In the ENCODE STAGES state, the controller continuously monitors the XOR-PASS module count and group count for each stage. For example, the controller or control unit may execute Algorithm 1, listed below, to track computations in the polar encoder.

Algorithm 1: Tracking computations in polar encoder

```
1:  stage = 1
2:  group = 0
3:  XOR-PASS = 0
4:  while slatge != 0 do (while stages remain)
5:  |     if (XOR-PASS = stage − 1) (last XOR-PASS module in group?)
6:  |     |     if (group = FLIP(stage)−1) (last group in stage?)
7:  |     |     |     (go to next stage)
8:  |     |     |     stage << 1
9:  |     |     |     group = 0
10: |     |     |     XOR-PASS = 0
11: |     |     else (go to next group in stage)
12: |     |     |     group = group + 1
13: |     |     |     XOR-PASS = 0
```

| Algorithm 1: Tracking computations in polar encoder |
| --- |
| 14:     \|          \|                    end if |
| 15:     \|          else (go to next XOR-PASS module in group) |
| 16:     \|          \|                    XOR-PASS = XOR-PASS + 1 |
| 17:     \|          end if |
| 18:  end while |

If all the XOR-PASS modules of a group are processed, then the controller checks if there is any other group left in the current stage. If all the groups are processed, the controller moves on to the next stage (shown as UPDATE in FIG. 8A). At each stage, the RAM read and write addresses are found with the procedure discussed below with reference to FIG. 8B.

Figure 8B:
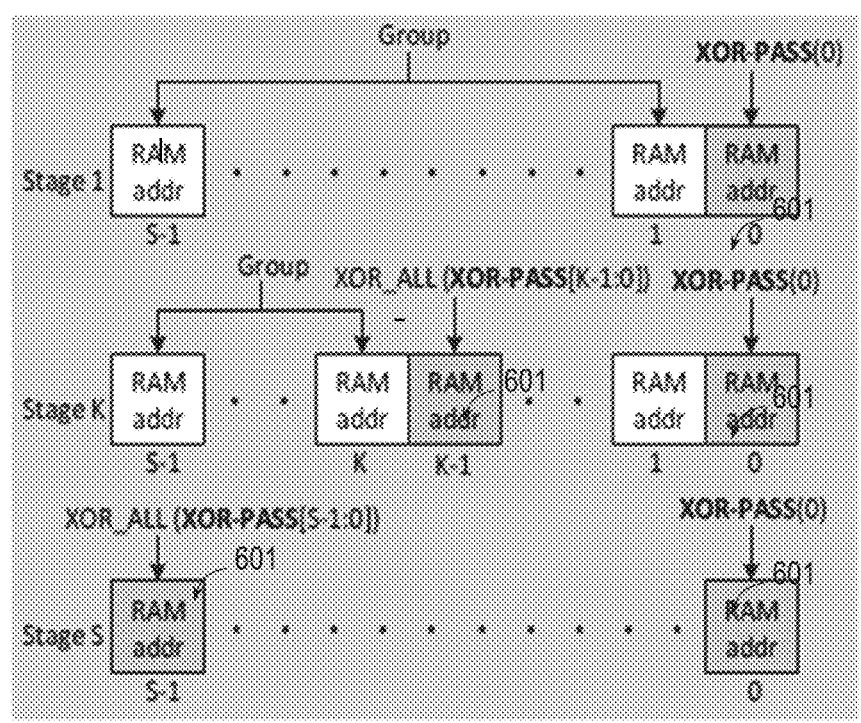
FIG. 8B is a schematic block diagram illustrating a procedure for calculating RAM addresses during polar encoding, according to some aspects of the present disclosure.

FIG. 8B illustrates a procedure for calculating RAM addresses (e.g., the read/write addresses to the RAM of FIG. 7) during polar encoding, according to some aspects of the present disclosure. In FIG. 8B, the RAM addresses are initialized with the group count right-shifted by the current stage count. The RAM addresses are calculated by XOR'ing the current XOR-PASS module number with all the previous RAM addresses. The procedure shown in FIG. 8B for RAM address calculations applies to RAM 0, while the address for RAM 1 can be computed by inverting all the entries 601 (i.e., the entries that depend on the XOR-PASS module number).

Once the addresses are calculated, it takes one clock cycle to read (or write) to RAM and one more to perform the XOR operation. In total 2 clock cycles are used for updating the RAM contents. This delay is controlled by the DELAY state, which delays the system by the time used to read and write data to the RAM plus the time used to perform computations. In the end, when all the stages are done, the state "OUTPUT LOAD" facilitates the reading of the output data (i.e., encoded output) from the RAM to the output data bus.

FIG. 8C illustrates an example of a code for calculating RAM addresses during polar encoding, according to some aspects of the present disclosure.

As an example, during stage=3, for group=1 and xor_module=1, then addresses may be calculated as follows:

First, the address is shifted by its group number and stage number. That is, RAM address=group number<<stage number; RAM address=1<<3=8.

Second, the RAM address index zero is assigned the index zero of xor_module. That is, RAM address[0]=xor_module[0]; for RAM 0, RAM address[0]=1001. Additionally, RAM address [1]=~xor_module[0]; for RAM 1, RAM address[0]=1000.

In the end, RAM addresses are XOR'ed with each index XOR_module. That is, when i=1, RAM address [i]=xor_module [i]^RAM address [i−1], 0^1=1; RAM address=1011 for RAM 0. For RAM 1, RAM address[i]=~xor_module[i]^RAM address[i−1], 1^1=0; RAM address=1001.

When i=2, RAM address[i]=xor_module [i]^RAM address [i−1], 0^1=1; RAM address=1111 for RAM 0. For RAM 1, RAM address [i]=~xor_module[i]^RAM address [i−1], 1^1=0; RAM address=1001. The value i may be less than the stage count. When the value i is greater than stage count, i may not increase further.

Figure 9:
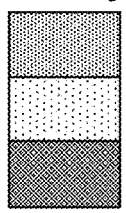
FIG. 9 is a table illustrating an example of a computation structure for a polar encoder with size 8, according to some aspects of the present disclosure.

Referring to FIG. 9, an example of table may be used by polar encoder in accordance with aspects of FIG. 8B and FIG. 8C, as well as FIG. 6, as described above. For example, FIG. 9 further describes the RAM addressing for the other stages, in a similar manner as described above in FIG. 8C for stage 3. Specifically, FIG. 9 is a table 900 illustrating an example of a computation structure for data RAM addressing, such as discussed above with regard to FIGS. 8B and 8C, for a polar encoder with size 8, such as discussed above with regard to the polar code factor graph 600 of FIG. 6, according to some aspects of the present disclosure. The table 900 includes columns for a RAM address (RAM), a group identification (GRP), and an XOR-PASS module identification (XOR-PASS) for each of a plurality of stage (e.g., Stage 1, Stage 2, and Stage 3), as well as a column for a RAM address associated with a codeword. For each RAM column, the first value (e.g., "0" or "1") indicates a first memory (e.g., RAM 0) or a second memory (e.g., RAM 1), and the number in parenthesis is the address for the RAM.

The RAM addressing procedure carried out by polar coder (e.g., FIG. 3), as described above with regard to FIGS. 8B and 8C, includes the following mechanisms/procedure to preserve the in-place attribute of the computation:

Input Switch: To obtain the input RAM address, when the XOR-PASS module number (see FIG. 8A) contains an odd number of 1's, set to 1 else set to 0. Here 0 means data from RAM 0 goes to an upper input and data from RAM 1 goes to a lower input, and 1 is the reverse;

Output Switch: To obtain the output RAM address, when the group number is odd, set opposite to input switch state, else set to same; and Per Stage: At each stage the RAM addresses are found with the system of FIG. 8B. As noted previously, the system shown applies only during computation and for addresses associated with RAM 0, while the addresses for RAM 1 can be found by inverting all the entries 601 (i.e. entries that depend on XOR-PASS module number).

For instance, and referring additionally to the polar code factor graph 600 of FIG. 6, the polar encoder (see, e.g., FIG. 3) uses the table 900 to track the following stages in this example according to the input switch, output switch, and per stage rules noted above:

Stage 1: 4 groups (GRP 0, GRP 1, GRP 2, and GRP 3), each having 1 XOR-PASS module (XOR-PASS 0);

Stage 2: 2 groups (GRP 0, GRP 1), each having 2 XOR-PASS modules (XOR-PASS 0, XOR-PASS 1);

Stage 3: 1 group (GRP 0) each having 4 XOR-PASS modules (XOR-PASS 0, XOR-PASS 1, XOR-PASS 2, XOR-PASS 3); and RAMs (RAM 0, RAM 1) and RAM addresses (RAM 0 (0), RAM 1(0), RAM 0 (1), RAM 1(1), RAM 0 (2), RAM 1(2), RAM 0 (3), RAM 1(3)) for the codeword.

Figure 10:
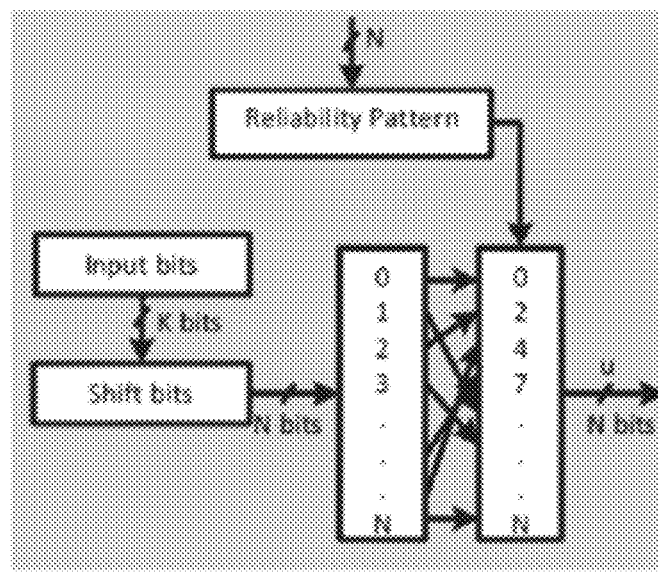
FIG. 10 is a schematic block diagram illustrating an example of a hardware architecture for frozen bit insertion in a polar encoder, according to some aspects of the present disclosure.

FIG. 10 is a schematic block diagram illustrating an example of a hardware architecture 900 for frozen bit insertion in a polar encoder, such as the polar encoder of FIG. 3 and/or FIG. 7, according to some aspects of the present disclosure. For example, the hardware architecture 900 may be used to implement the frozen bit insertion block of FIG. 3.

As for any other channel coding method where redundancy is used to recover the information bits at the receiver side, polar codes also use the redundancy in the form of frozen bits which are usually set to zero. The information bits obtained after interleaving, are appended with frozen bits so that the output from frozen insertion becomes the input to the polar encoder (shown in FIG. 3). The total number of needed frozen bits (F) can be found by subtracting K with N, i.e., F=K−N, where N is the length of the polar code. For PDCCH, N ∈{32, 64, 128, 256, 512, 1024}. The selection of which of the N bits are assigned to the information bits K and which of them are assigned to frozen bits F, depends on the so-called reliability sequence $Q_0^{N-1}$ in the polar code, which ranks the reliability of sequence of N bits position, and also on the rate matching sequence.

In some instances, a reliability sequence $Q_0^{N_{max}-1}$ for $N_{max}=1024$ may be defined or provided. For code lengths other than $N_{max}=1024$, the reliability sequence is the subset of the defined sequence $N_{max}=1024$. For example, to find a reliability sequence for $Q_0^{63}$ for N=64, all the indices greater than 64 are removed from the $Q_0^{N_{max}-1}$ sequence, and all the remaining indices are concatenated in order.

As for PDCCH N ∈{32, 64, 128, 256, 512, 1024}, reliability sequences of 5 different code lengths excluding N=1024 are to be calculated. In an aspect, the reliability indices for N ∈{32, 64, 128, 256, 512, 1024} can be stored in the read-only memory (ROM), and these indices can be loaded when the system starts/boots.

As shown in FIG. 10, the information bits are first shifted right by N-K times to obtain an N bit vector $u=[u_0, u_1, u_2, \ldots, u_{N-1}]$. The resulting vector $u_0^{N-1}$ may include K information bits preceded by N-K frozen bits (e.g., zeros in the illustrated example of FIG. 10). Based on the value of N, the corresponding reliability sequence $Q_0^{N-1}$ is loaded from the ROM. The vector $u_0^{N-1}$ is then interleaved according to the loaded sequence pattern $Q_0^{N-1}$ which places the bits according to their reliability sequences.

In some examples, for N=1024 and 3 symbols PDCCH DCI payload, a PDCCH encoding chain using the polar encoder discussed herein can support encoding up to 164 resource blocks.

Figure 11A:
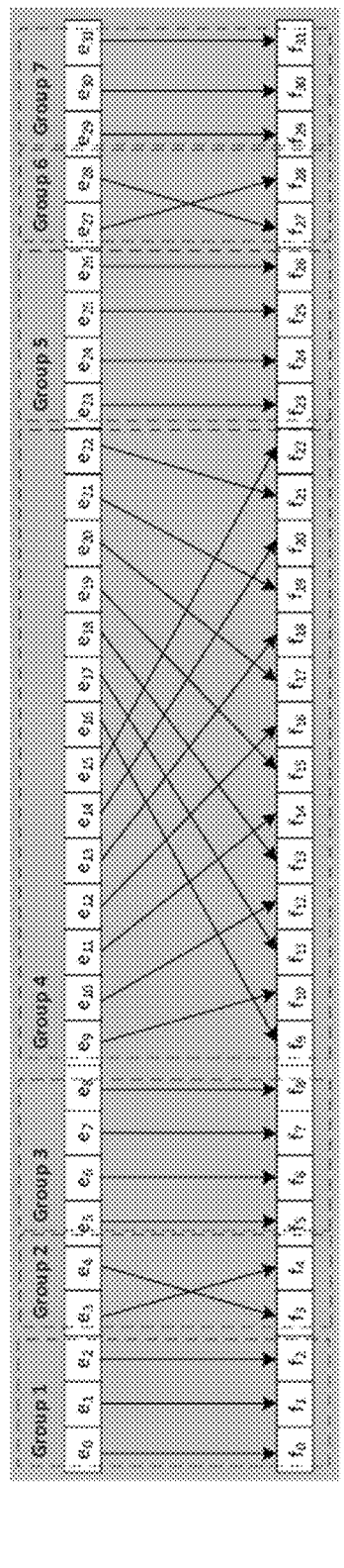
FIG. 11A is a schematic block diagram illustrating an example of a sub-block interleaver scheme for a 32 bit interleaver, according to some aspects of the present disclosure.

FIG. 11A is a schematic block diagram illustrating an example of a sub-block interleaver scheme 1100. The scheme 1100 may be implemented by the rate matcher in the channel encoder of FIG. 3.

The rate matcher 1100 may adjust the code length E (i.e., the number of encoded bits at the output of the rate matcher) to match the payload allocation in the resource elements of the DCI. There are three methods to adjust the encoded length N to E in 5G NR polar coding, namely: puncturing, shortening, and repetition. More specifically, repetition is applied when E≥N, and puncturing or shortening is applied when E<N. In 5G NR PDCCH, all three methods of rate matching are implemented by size-N sub-block interleaving and bit selection.

The input data $c_0^{N-1}=[c_0, c_1, \ldots, c_{N-1}]$ to sub-block interleaver is the encoded data from the polar encoder. The output from the sub-block interleaver is denoted by $f_0^{N-1}=[f_0, f_1, f_{N-1}]$, which also has a length N and may be a multiple of 32. Sub-block interleaving is performed by decomposing the N bits $c_0^{N-1}=[c_0, c_1, \ldots, c_{N-1}]$ into 32 sub-blocks each comprising of a different set of N/32 consecutive bits. In some examples, a sub-block interleaver may be defined and used to rearrange the order of 32-bit sub-blocks. An example of sub-block interleaving is shown in FIG. 11A. This pattern can be extended to any length N.

In an aspect, an interleaver pattern can be divided into four types of groups as shown in FIG. 11A, where each group has a specific mapping that can be extended to any length N. In the illustrated example of FIG. 11A, the sub-block interleaver is for a 32-bits code. Group 1 for the 32-bit sub-block interleaver includes 3 bits, group 2 includes 2 bits, group 3 includes 4 bits, and Group 4 includes 14 bits. Groups 5, 6, and 7 are replicas of Groups 3, 2, and 1, respectively. For a 64-bit sub-block interleaver, each group may include twice the amount of bits as in the 32-bit sub-block interleaver. For a 128-bit interleaver, each group may have 4 times the bits as in a 32-bit interleaver, and so on. Thus, for any length N, one can find out the number of bits in each group. Notice from FIG. 11A that the first address (e.g., denoted by $A_s$) of the first bit in each group can be computed if the code length N is known. For example, for the 32-bit interleaver in FIG. 11A, the first bit in group 4 has address 9. Similarly, the address of the first bit in group 3 is 5. By having the knowledge of the total number of bits in a group and their starting addresses ($A_s$), we can find the addresses of all the bits in a group simply by calculating the offsets from the starting address. The offsets can be computed with shifting and addition operations. The calculated addresses can then be used to interleave the encoded data. The addresses for the Groups 1 and 7 (e.g., denoted by $A_{g1}$ and $A_{g7}$, respectively), can be calculated as:

$$A_{g1}[i], A_{g1}[i] = A_s + C_{bit} + i, \quad (4)$$

where $C_{bit}$ is the current bit in the group and i is the address group for the current clock cycle. There is one address group for N=32 bits, 2 address groups for N=64 bits, and so on. As there are 3 bits in Group 1 and 7 for N=32, i increments by 3 with every clock cycle. The addresses for Group 2 and 6, and for Group 3 and 5 are given as:

$$A_{g2}[i] = A_s + i; i = i + 2, \quad (5)$$

$$A_{g6}[i] = A_s + N/32 + i; i = i + 2, \quad (6)$$

$$A_{g3}[i], A_{g5}[i] = A_s + (i << 2) + C_{bit}; i = i + 1. \quad (7)$$

The addresses for Group 4 can be found by the following equations:

$$A_{g4}[j] = A_s + i + (C_{bit} << N/32), A_{g4}[j] = i + (N >> 1) + (C_{bit} << N/32), \quad (8)$$

where j=j+14, and i=i+1.

Figure 11B:
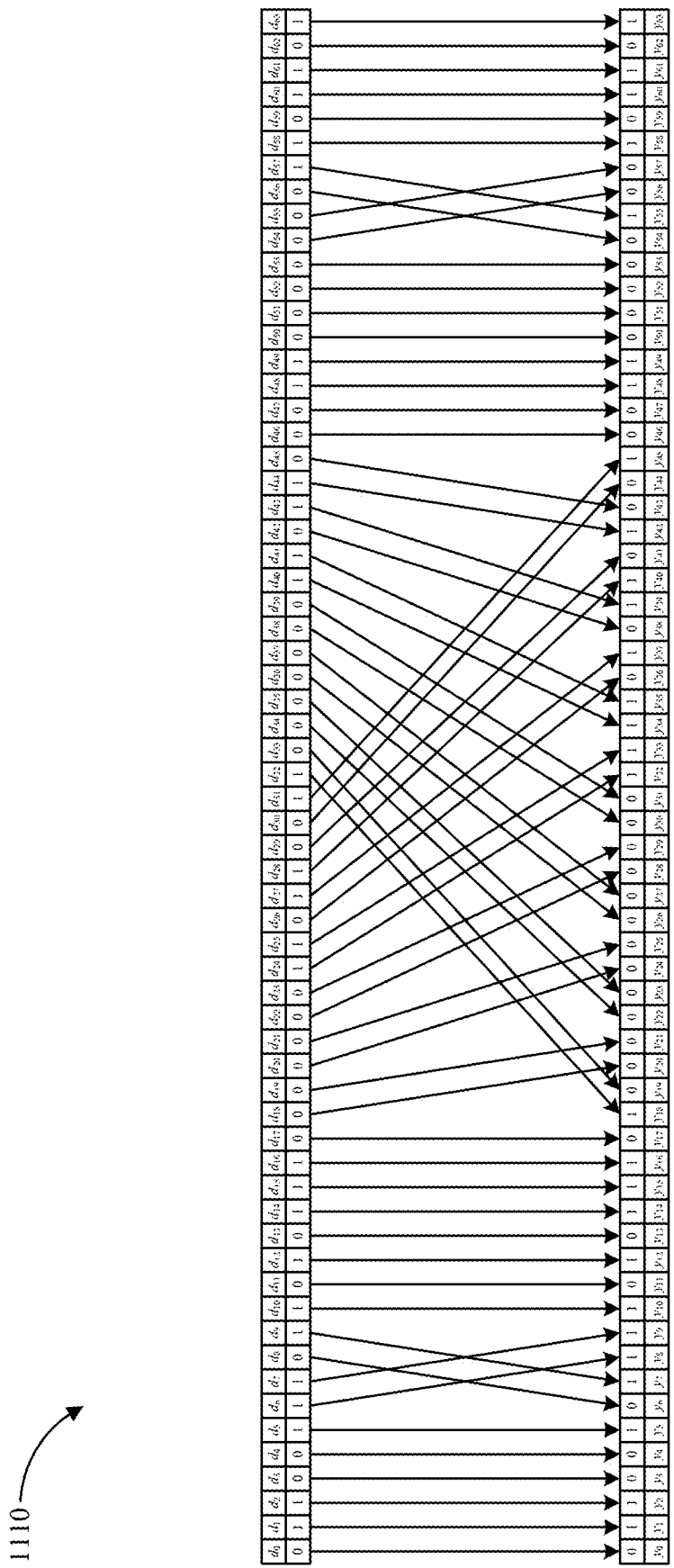
FIG. 11B is a schematic block diagram illustrating an example of a sub-block interleaver scheme for a 64 bit interleaver, according to some aspects of the present disclosure.

FIG. 11B is a schematic block diagram illustrating an example of a sub-block interleaver scheme 1110. The scheme 1110 may be implemented by the rate matcher in the channel encoder of FIG. 3. The scheme 1110 is substantially similar to the scheme 1100 but is shown for a codeword length of 64 (e.g., N=64) instead of 32.

Figure 12:
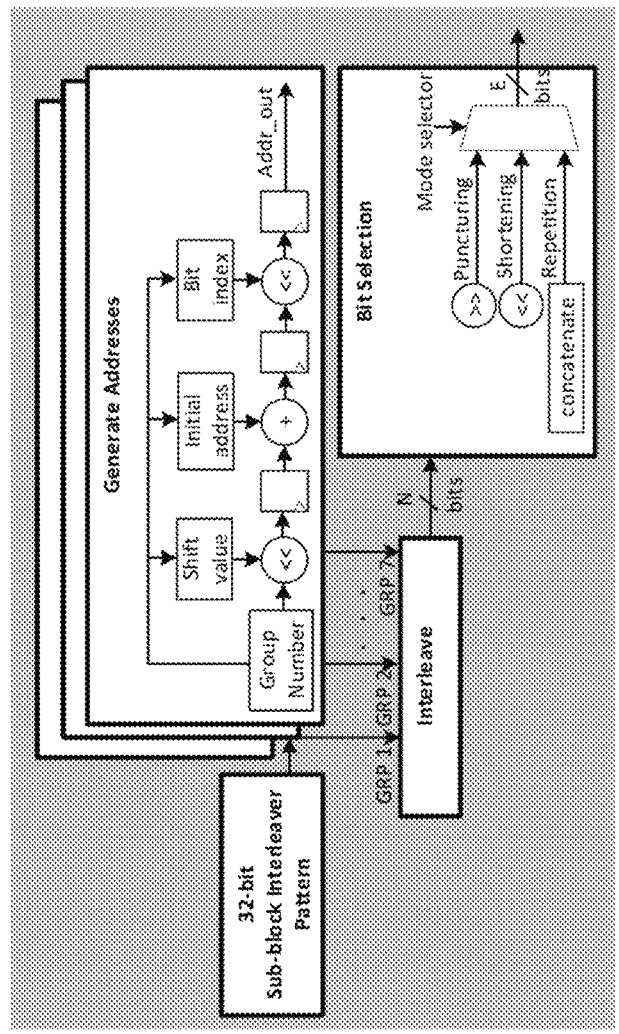
FIG. 12 is a schematic block diagram illustrating an example of a rate matcher, according to some aspects of the present disclosure.

FIG. 12 is a schematic block diagram illustrating an example of a hardware architecture for a rate matcher 1200, according to some aspects of the present disclosure. The rate matcher 1200 may correspond to the rate matcher in the channel encoder 300 of FIG. 3. As shown, the rate matcher 1100 may include a generate address block, a sub-block interleaving block, and a bit-selection block.

The initial addresses ($A_s$) for each group for all supported lengths (i.e., N={32, 64, 128, 256, 512, 1024}) by PDCCH, are stored in a register that can be accessed on run-time. The starting addresses ($A_s$) for each group are then used to generate the addresses of the rest of the bits in each group. A general method to calculate the addresses of bits in any group based on equations (4) to (8) above is shown in FIG. 12. Based on the group number, the starting address of the group is accessed and added to the current index of the bit $C_{bit}$. Then, it is determined whether a shift operation is needed or not based on the group number. In case a shift operation is needed, the address value is shifted by the calculated shift value. In the end, the number of bits in the group is shifted by its location in the group $C_{bit}$ to obtain the final address. Thus, to compute the address of a particular bit in a group, three arithmetic operations including shift and addition operations may be used, where the 3 operations can be completed in three clock cycles, as shown in FIG. 9. The generate address block in FIG. 12 can be executed in parallel to generate indices of all 7 groups in three clock cycles.

At any given time, the hardware architecture of the generate address block, shown in FIG. 12, can generate 32 addresses in parallel. So, for a 32-bit interleaver, once the addresses are calculated, the 32 bits are available for interleaving and the interleaving can be performed in one clock cycle. For a 64-bit interleaver, the interleaving can be performed in two clock cycles, and so on for higher lengths of N. The total clock cycles ($T_{CC}$) needed to interleave the encoded data may equal to clock cycles (CC) needed to generate addresses ($T_G$) plus the interleaving time i.e., $T_{CC}=T_G+N/32$.

The second step in rate matching is bit selection, which is employed to adjust the length of the sub-block interleaved bit sequence $f_0^{N-1}=[f_0, f_1, \ldots, f_{N-1}]$ from N bits to E bits. If E≥N, then repetition is used. In repetition, the initial bit indices from 0 to (E−N) are chosen from $f_0^{N-1}$ and appended at the end of $f_0^{N-1}$ to achieve $e_0^{N-1}=[e_0, e_1, \ldots, e_{E-1}]$. If E M<N and K≤7/16, then puncturing is used. In case of puncturing, the indices from 0 to (N-E) are removed from $f_0^{N-1}$ to form $e_0^{N-1}$. In hardware, puncturing and shortening can be achieved by shifting the bits right or left by (N-E) times in the vector $f_0^{N-1}$, respectively (shown in FIG. 12). Repetition can be realized in hardware by concatenating the initial (E-N) bits of vector $f_0^{N-1}$ to itself. A MUX is used to select between three modes of bit selection, as shown in FIG. 12. Both shifting and concatenation operations can be performed in one clock cycle and consumes little hardware.

In some examples, for N=1024 and 3 symbols PDCCH DCI payload, a PDCCH encoding chain using the rate matcher discussed herein can support encoding up to 164 resource blocks.

Figure 13:
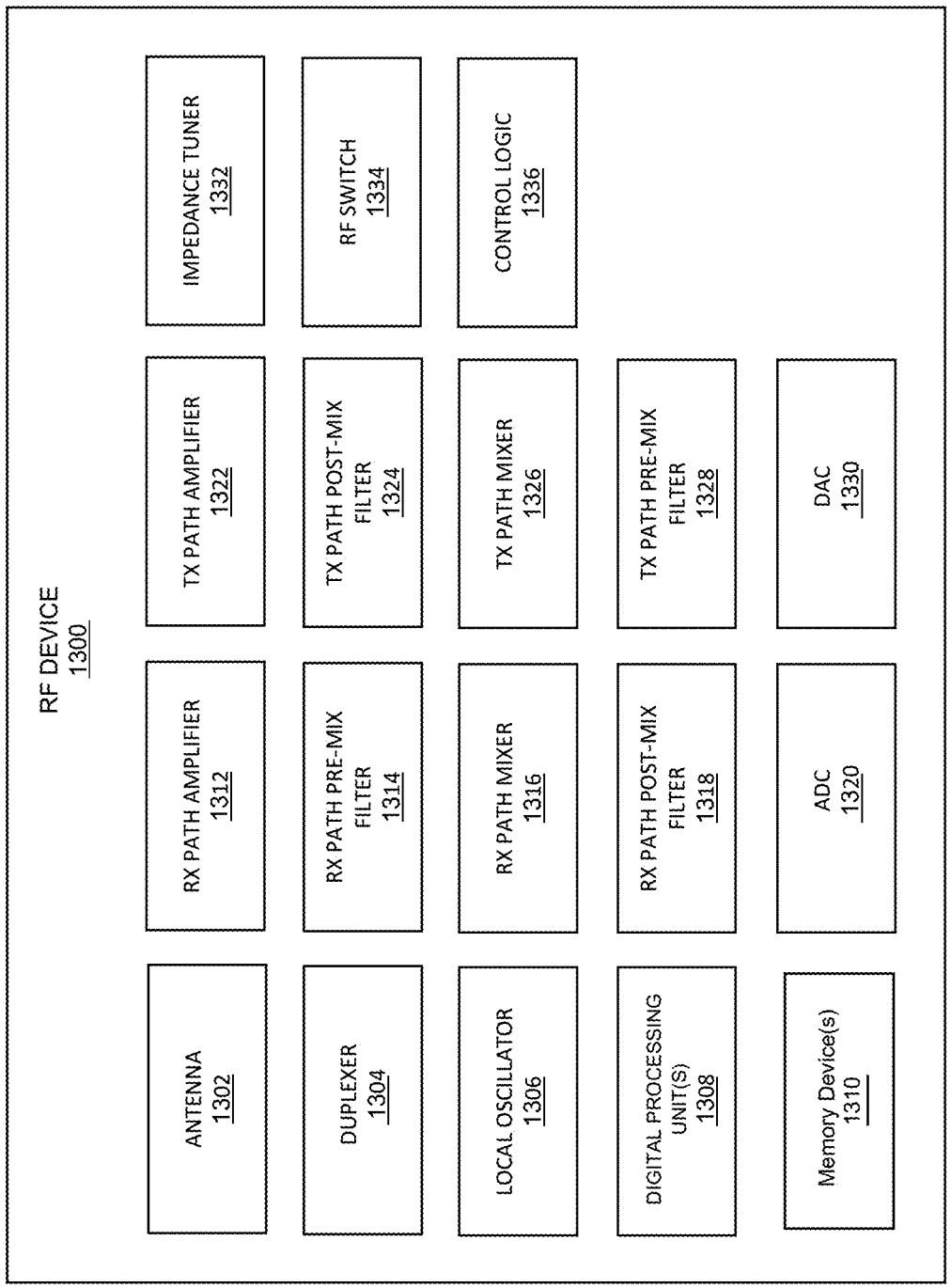
FIG. 13 is block diagram illustrating an example of a wireless communications device, e.g., an RF device, in which cyclic redundancy checking (CRC) interleaving, polar coding, and/or rate matching as disclosed herein may be implemented, according to aspects of the present disclosure.

FIG. 13 is block diagram illustrating an example of a RF device 1300, including any wireless communication device having an RF transceiver, in which CRC interleaving, polar coding, and/or rate matching as disclosed herein may be implemented, according to aspects of the present disclosure.

In general, the RF device 1300 may be any device or system that may support wireless transmission and/or reception of signals in the form of electromagnetic waves in the RF range of approximately 3 kilohertz (kHz) to approximately 300 Gigahertz (GHz). In some aspects, the RF device 1300 may be used for wireless communications, e.g., in a base station (BS) or a UE device of any suitable cellular wireless communications technology, such as GSM, WCDMA, or LTE. In a further example, the RF device 1300 may be used as, or in, e.g., a BS, an RRH, or a UE device of a millimeter-wave wireless technology such as fifth generation (5G) wireless (i.e., high-frequency/short wavelength spectrum, e.g., with frequencies in the range between about 20 and 60 GHz, corresponding to wavelengths in the range between about 5 and 15 millimeters). In yet another example, the RF device 1300 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF device 1300 may be used for wireless communications using Bluetooth technology (e.g., a frequency band from about 2.4 to about 2.485 GHz, corresponding to a wavelength of about 12 cm). In other aspects, the RF device 1300 may be used for transmitting and/or receiving RF signals for purposes other than communication, e.g., in an automotive radar system, or in medical applications such as magneto-resonance imaging (MRI).

In various aspects, the RF device 1300 may be included in frequency-division duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

Several components are illustrated in FIG. 13 as included in the RF device 1300, but any one or more of these components may be omitted or duplicated, as suitable for the application. For example, in some aspects, the RF device 1300 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other aspects, the RF device 1300 may be an RF device supporting wireless reception (e.g., an RF receiver), in which case it may include the components of the RX path, but not the components of the TX path; or the RF device 1300 may be an RF device supporting wireless transmission (e.g., an RF transmitter), in which case it may include the components of the TX path, but not the components of the RX path.

In some aspects, some or all the components included in the RF device 1300 may be attached to one or more motherboards. In some aspects, some or all these components are fabricated on a single die, e.g., on a single system on chip (SoC) die.

Additionally, in various aspects, the RF device 1300 may not include one or more of the components illustrated in FIG. 13, but the RF device 1300 may include interface circuitry for coupling to the one or more components. For example, the RF device 1300 may not include an antenna 1302, but may include antenna interface circuitry (e.g., a matching circuitry, a connector and driver circuitry) to which an antenna 1302 may be coupled. In another set of examples, the RF device 1300 may not include a digital processing unit 1308 or a local oscillator 1306, but may include device interface circuitry (e.g., connectors and supporting circuitry) to which a digital processing unit 1308 or a local oscillator 1306 may be coupled.

As shown in FIG. 13, the RF device 1300 may include an antenna 1302, a duplexer 1304 (e.g., if the RF device 1300 is an FDD RF device; otherwise the duplexer 1304 may be omitted), a local oscillator 1306, a digital processing unit 1308. As also shown in FIG. 13, the RF device 1300 may include an RX path that may include an RX path amplifier 1312, an RX path pre-mix filter 1314, a RX path mixer 1316, an RX path post-mix filter 1318, and an analog-to-digital converter (ADC) 1320. As further shown in FIG. 13, the RF device 1300 may include a TX path that may include a TX path amplifier 1322, a TX path post-mix filter 1324, a TX path mixer 1326, a TX path pre-mix filter 1328, and a digital-to-analog converter (DAC) 1330. Still further, the RF device 1300 may further include an impedance tuner 1332, an RF switch 1334, and control logic 1336. In various aspects, the RF device 1300 may include multiple instances of any of the components shown in FIG. 13. In some aspects, the RX path amplifier 1312, the TX path amplifier 1322, the duplexer 1304, and the RF switch 1334 may be considered to form, or be a part of, an RF front-end (FE) of the RF device 1300. In some aspects, the RX path amplifier 1312, the TX path amplifier 1322, the duplexer 1304, and the RF switch 1334 may be considered to form, or be a part of, an RF FE of the RF device 1300. In some aspects, the RX path mixer 1316 and the TX path mixer 1326 (possibly with their associated pre-mix and post-mix filters shown in FIG. 13) may be considered to form, or be a part of, an RF transceiver of the RF device 1300 (or of an RF receiver or an RF transmitter if RX path or TX path components, respectively, are included in the RF device 1300). In some aspects, the RF device 1300 may further include one or more control logic elements/circuits, shown in FIG. 13 as control logic 1336, e.g., an RF FE control interface. In some aspects, the control logic 1336 may be used to control other functions within the RF device 1300, e.g., enhance control of complex RF system environment, support implementation of envelope tracking techniques, reduce dissipated power, etc.

The antenna 1302 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 1300 is an FDD transceiver, the antenna 1302 may be configured for concurrent reception and transmission of communication signals in separate, i.e., non-overlapping and non-continuous, bands of frequencies, e.g., in bands having a separation of, e.g., 20 MHz from one another. If the RF device 1300 is a TDD transceiver, the antenna 1302 may be configured for sequential reception and transmission of communication signals in bands of frequencies that may be the same or overlapping for TX and RX paths. In some aspects, the RF device 1300 may be a multi-band RF device, in which case the antenna 1302 may be configured for concurrent reception of signals having multiple RF components in separate frequency bands and/or configured for concurrent transmission of signals having multiple RF components in separate frequency bands. In such aspects, the antenna 1302 may be a single wide-band antenna or a plurality of band-specific antennas (i.e., a plurality of antennas each configured to receive and/or transmit signals in a specific band of frequencies). In various aspects, the antenna 1302 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some aspects, the RF device 1300 may include more than one antenna 1302 to implement antenna diversity. In some such aspects, the RF switch 1334 may be deployed to switch between different antennas.

An output of the antenna 1302 may be coupled to the input of the duplexer 1304. The duplexer 1304 may be any suitable component configured for filtering multiple signals to allow for bidirectional communication over a single path between the duplexer 1304 and the antenna 1302. The duplexer 1304 may be configured for providing RX signals to the RX path of the RF device 1300 and for receiving TX signals from the TX path of the RF device 1300.

The RF device 1300 may include one or more local oscillators 1306, configured to provide local oscillator signals that may be used for downconversion of the RF signals received by the antenna 1302 and/or upconversion of the signals to be transmitted by the antenna 1302.

The RF device 1300 may include one or more digital processing unit(s) 1308, which may include one or more processing devices or processors that, individually or in any combination, are configured to perform the actions described herein with regard to processing TX and/or RX signals and information. The digital processing unit 1308 may be configured to perform various functions related to digital processing of the RX and/or TX signals, including the channel encoding actions related to CRC interleaving, polar coding, and/or rate matching as described herein. Examples of such functions include, but are not limited to, decimation/downsampling, error correction, digital downconversion or upconversion, DC offset cancellation, automatic gain control, etc. In some aspects, the digital processing unit 1308 may implement PDCCH channel encoding, including CRC interleaving, polar coding, and/or rate matching as discussed herein.

Additionally, in some aspects, the RF device 1300 may further include one or more memory device(s) 1310 or memory/memories, configured to cooperate with the digital processing unit 1308. The memory device(s) 1310 may include one or more of any type of a storage medium, such as a non-transitory storage medium such as a random access memory (RAM) and/or a read-only memory (ROM), configured to store computer-readable instructions. For example, in some implementations, one or more sets of computer-readable instructions, e.g., stored on a single memory or distributed across a plurality of memories, may be executed by a single processor or by a plurality of processors to perform the channel encoding actions related to CRC interleaving, polar coding, and/or rate matching as described herein.

Turning to the details of the RX path that may be included in the RF device 1300, the RX path amplifier 1312 may include a low-noise amplifier (LNA). An input of the RX path amplifier 1312 may be coupled to an antenna port (not shown) of the antenna 1302, e.g., via the duplexer 1304. The RX path amplifier 1312 may amplify the RF signals received by the antenna 1302.

An output of the RX path amplifier 1312 may be coupled to an input of the RX path pre-mix filter 1314, which may be a harmonic or band-pass (e.g., low-pass) filter, configured to filter received RF signals that have been amplified by the RX path amplifier 1312.

An output of the RX path pre-mix filter 1314 may be coupled to an input of the RX path mixer 1316, also referred to as a downconverter. The RX path mixer 1316 may include two inputs and one output. A first input may be configured to receive the RX signals, which may be current signals, indicative of the signals received by the antenna 1302 (e.g., the first input may receive the output of the RX path pre-mix filter 1314). A second input may be configured to receive local oscillator signals from one of the local oscillators 1306. The RX path mixer 1316 may then mix the signals received at its two inputs to generate a downconverted RX signal, provided at an output of the RX path mixer 1316. As used herein, downconversion refers to a process of mixing a received RF signal with a local oscillator signal to generate a signal of a lower frequency. In particular, the TX path mixer (e.g., downconverter) 1316 may be configured to generate the sum and/or the difference frequency at the output port when two input frequencies are provided at the two input ports. In some aspects, the RF device 1300 may implement a direct-conversion receiver (DCR), also known as homodyne, synchrodyne, or zero-IF receiver, in which case the RX path mixer 1316 may be configured to demodulate the incoming radio signals using local oscillator signals whose frequency is identical to, or close to the carrier frequency of the radio signal. In other aspects, the RF device 1300 may make use of downconversion to an intermediate frequency (IF). IFs may be used in superheterodyne radio receivers, in which a received RF signal is shifted to an IF before the final detection of the information in the received signal is done. Conversion to an IF may be useful for several reasons. For example, when several stages of filters are used, they can all be set to a fixed frequency, which makes them easier to build and to tune. In some aspects, the RX path mixer 1316 may include several such stages of IF conversion.

Although a single RX path mixer 1316 is shown in the RX path of FIG. 13, in some aspects, the RX path mixer 1316 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 1302 and an in-phase component of the local oscillator signal provided by the local oscillator 1306. The second RX path mixer may be configured for performing downconversion to generate a quadrature (Q) downconverted RX signal by mixing the RX signal received by the antenna 1302 and a quadrature component of the local oscillator signal provided by the local oscillator 1306 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 1316 may, optionally, be coupled to the RX path post-mix filter 1318, which may be low-pass filters. In case the RX path mixer 1316 is a quadrature mixer that implements the first and second mixers as described above, the in-phase and quadrature components provided at the outputs of the first and second mixers respectively may be coupled to respective individual first and second RX path post-mix filters included in the filter 1318.

The ADC 1320 may be configured to convert the mixed RX signals from the RX path mixer 1316 from analog to digital domain. The ADC 1320 may be a quadrature ADC that, like the RX path quadrature mixer 1316, may include two ADCs, configured to digitize the downconverted RX path signals separated in in-phase and quadrature components. The output of the ADC 1320 may be provided to the digital processing unit 1308, configured to perform various functions related to digital processing of the RX signals so that information encoded in the RX signals can be extracted.

Turning to the details of the TX path that may be included in the RF device 1300, the digital signal to later be transmitted (TX signal) by the antenna 1302 may be provided, from the digital processing unit 1308, to the DAC 1330. Like the ADC 1320, the DAC 1330 may include two DACs, configured to convert, respectively, digital I- and Q-path TX signal components to analog form.

Optionally, the output of the DAC 1330 may be coupled to the TX path pre-mix filter 1328, which may be a band-pass (e.g., low-pass) filter (or a pair of band-pass, e.g., low-pass, filters, in case of quadrature processing) configured to filter out, from the analog TX signals output by the DAC 1330, the signal components outside of the desired band. The digital TX signals may then be provided to the TX path mixer 1326, which may also be referred to as an upconverter. Like the RX path mixer 1316, the TX path mixer 1326 may include a pair of TX path mixers, for in-phase and quadrature component mixing. Like the first and second RX path mixers that may be included in the RX path, each of the TX path mixers of the TX path mixer 1326 may include two inputs and one output. A first input may receive the TX signal components, converted to the analog form by the respective DAC 1330, which are to be upconverted to generate RF signals to be transmitted. The first TX path mixer may generate an in-phase (I) upconverted signal by mixing the TX signal component converted to analog form by the DAC 1330 with the in-phase component of the TX path local oscillator signal provided from the local oscillator 1306 (in various aspects, the local oscillator 1306 may include a plurality of different local oscillators, or be configured to provide different local oscillator frequencies for the mixer 1316 in the RX path and the mixer 1326 in the TX path). The second TX path mixer may generate a quadrature phase (Q) upconverted signal by mixing the TX signal component converted to analog form by the DAC 1330 with the quadrature component of the TX path local oscillator signal. The output of the second TX path mixer may be added to the output of the first TX path mixer to create a real RF signal. A second input of each of the TX path mixers may be coupled the local oscillator 1306.

Optionally, the RF device 1300 may include the TX path post-mix filter 1324, configured to filter the output of the TX path mixer 1326.

In various aspects, any of the RX path pre-mix filter 1314, the RX path post-mix filter 1318, the TX post-mix filter 1324, and the TX pre-mix filter 1328 may be implemented as RF filters. In some aspects, an RF filter may be implemented as a plurality of RF filters, or a filter bank. A filter bank may include a plurality of RF filters that may be coupled to a switch, e.g., the RF switch 1334, configured to selectively switch any one of the plurality of RF filters on and off (e.g., activate any one of the plurality of RF filters), in order to achieve desired filtering characteristics of the filter bank (i.e., in order to program the filter bank). For example, such a filter bank may be used to switch between different RF frequency ranges when the RF device 1300 is, or is included in, a BS or in a UE device. In another example, such a filter bank may be programmable to suppress TX leakage on the different duplex distances.

The impedance tuner 1332 may include any suitable circuitry, configured to match the input and output impedances of the different RF circuitries to minimize signal losses in the RF device 1300. For example, the impedance tuner 1332 may include an antenna impedance tuner. Being able to tune the impedance of the antenna 1302 may be particularly advantageous because antenna's impedance is a function of the environment that the RF device 1300 is in, e.g., antenna's impedance changes depending on, e.g., if the antenna is held in a hand, placed on a car roof, etc.

As described above, the RF switch 1334 may be a device configured to route high-frequency signals through transmission paths, e.g., in order to selectively switch between a plurality of instances of any one of the components shown in FIG. 13, e.g., to achieve desired behavior and characteristics of the RF device 1300. For example, in some aspects, an RF switch may be used to switch between different antennas 1302. In other aspects, an RF switch may be used to switch between a plurality of RF filters (e.g., by selectively switching RF filters on and off) of the RF device 1300. Typically, an RF system would include a plurality of such RF switches.

The RF device 1300 provides a simplified version and, in further aspects, other components not specifically shown in FIG. 13 may be included. For example, the RX path of the RF device 1300 may include a current-to-voltage amplifier between the RX path mixer 1316 and the ADC 1320, which may be configured to amplify and convert the downconverted signals to voltage signals. In another example, the RX path of the RF device 1300 may include a balun transformer for generating balanced signals. In yet another example, the RF device 1300 may further include a clock generator, which may, e.g., include a suitable phased-lock loop (PLL), configured to receive a reference clock signal and use it to generate a different clock signal that may then be used for timing the operation of the ADC 1320, the DAC 1330, and/or that may also be used by the local oscillator 1306 to generate the local oscillator signals to be used in the RX path or the TX path. In general, RF device 1300 may include clock generation circuitries or PLL in various domains such as in a RF domain, a digital I/O domain (e.g., for communications with devices outside of the RF device), clock domain, etc.

Figure 14:
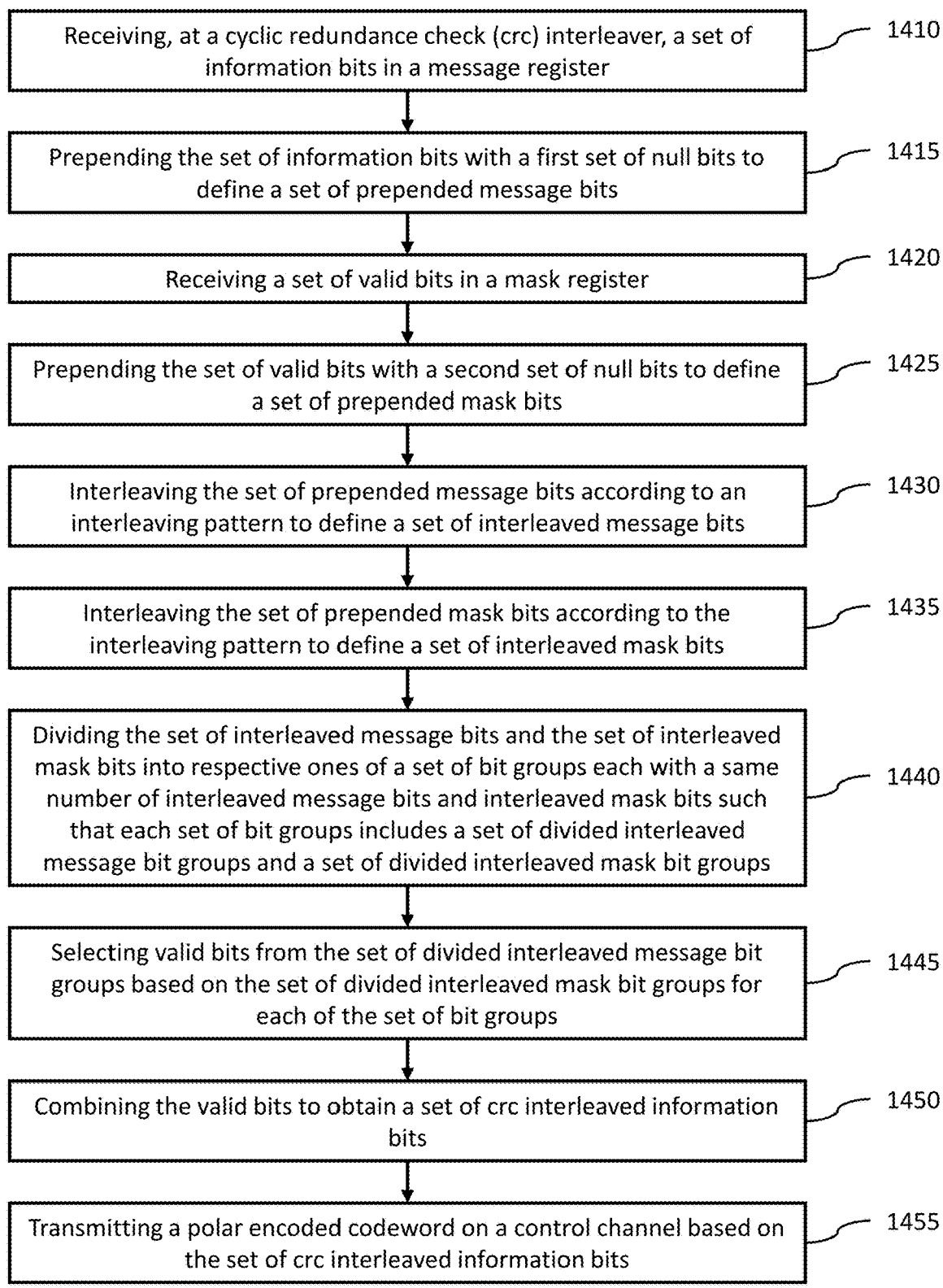
FIG. 14 is a flowchart of an example method for cyclic redundancy checking (CRC) interleaving for wireless communications according to some aspects of the present disclosure.

FIG. 14 is a flowchart of an example method 1400 for cyclic redundancy checking (CRC) interleaving for wireless communications according to some aspects of the present disclosure. The method as described herein with relation to FIG. 14 are based upon the elements discussed relative to FIGS. 1, 2, 3, 4, 5 and 13, as described above. In one implementation, for instance, method 1400 is performed by one or more digital processing units 1308 executing instructions to perform the actions of the CRC interleaving block of FIG. 3, and as described in the related figures, wherein such instructions may be stored in one or more memories 1310. In another implementation, for instance, method 1400 is performed by a wireless communication device, such as RF device 1300, implementing at least the CRC interleaving block of FIG. 3, and as described in the related figures, based on execution of corresponding instructions in one or more memories 1310 by one or more digital processing units 1308.

At step 1410, method 1400 includes receiving, at a cyclic redundance check (CRC) interleaver, a set of information bits in a message register. At step 1415, method 1400 includes prepending the set of information bits with a first set of NULL bits to define a set of prepended message bits. At step 1420, method 1400 includes receiving a set of valid bits in a mask register. At step 1425, method 1400 includes prepending the set of valid bits with a second set of NULL bits to define a set of prepended mask bits. At step 1430, method 1400 includes interleaving the set of prepended message bits according to an interleaving pattern to define a set of interleaved message bits. At step 1435, method 1400 includes interleaving the set of prepended mask bits according to the interleaving pattern to define a set of interleaved mask bits. At step 1440, method 1400 includes dividing the set of interleaved message bits and the set of interleaved mask bits into respective ones of a set of bit groups each with a same number of interleaved message bits and interleaved mask bits such that each set of bit groups includes a set of divided interleaved message bit groups and a set of divided interleaved mask bit groups. At step 1445, method 1400 includes selecting valid bits from the set of divided interleaved message bit groups based on the set of divided interleaved mask bit groups for each of the set of bit groups.

At step 1450, method 1400 includes combining the valid bits to obtain a set of CRC interleaved information bits. At step 1455, method 1400 includes transmitting a polar encoded codeword on a control channel based on the set of CRC interleaved information bits.

In an alternative or additional aspect of method 1400, the set information bits comprise downlink control information bits and CRC bits.

In an alternative or additional aspect of method 1400, the control channel further comprises a physical downlink control channel.

In an alternative or additional aspect of method 1400, the dividing of the set of interleaved message bits and the dividing of the set of interleaved mask bits is performed in parallel.

In an alternative or additional aspect of method 1400, the selecting of the valid bits is performed in parallel by a plurality of multiplexers, including inputting corresponding ones of the set of divided interleaved message bit groups and set of divided interleaved mask bit groups into each of the plurality of multiplexers, and using mask bits from each of the set of divided interleaved mask bit groups by each of the plurality of multiplexers as a selector to select respective ones of the valid bits.

In an alternative or additional aspect of method 1400, combining the valid bits to obtain the set of CRC interleaved information bits further comprises: dividing the valid bits into a plurality of blocks of valid bits; and performing, in parallel, on each of the plurality of blocks of valid bits: identifying a first set of valid bits based on a counter; and selecting a second set of valid bits from the first set of valid bits based on a number of valid bits in a respective block of the plurality of valid bits; and combining each second set of valid bits of the plurality of blocks of valid bits to obtain the set of CRC interleaved information bits.

In an alternative or additional aspect of method 1400, a number of each of the set of information bits and the set of valid bits is >0 and less than 164, and the message register and the mask register each have a 164 bit length.

In an alternative or additional aspect of method 1400, each of the first set of NULL bits and the second set of NULL bits are zeros, and a number of NULL bits in each of the first set of NULL bits and the second set of NULL bits is equal to 164-K, wherein K>0.

In an alternative or additional aspect of method 1400, the valid bits are ones.

In an alternative or additional aspect of method 1400, the same number of interleaved message bits and interleaved mask bits in each of the set of bit groups is 5, wherein selecting the valid bits comprises selecting by a 32 bit multiplexer.

Figure 15:
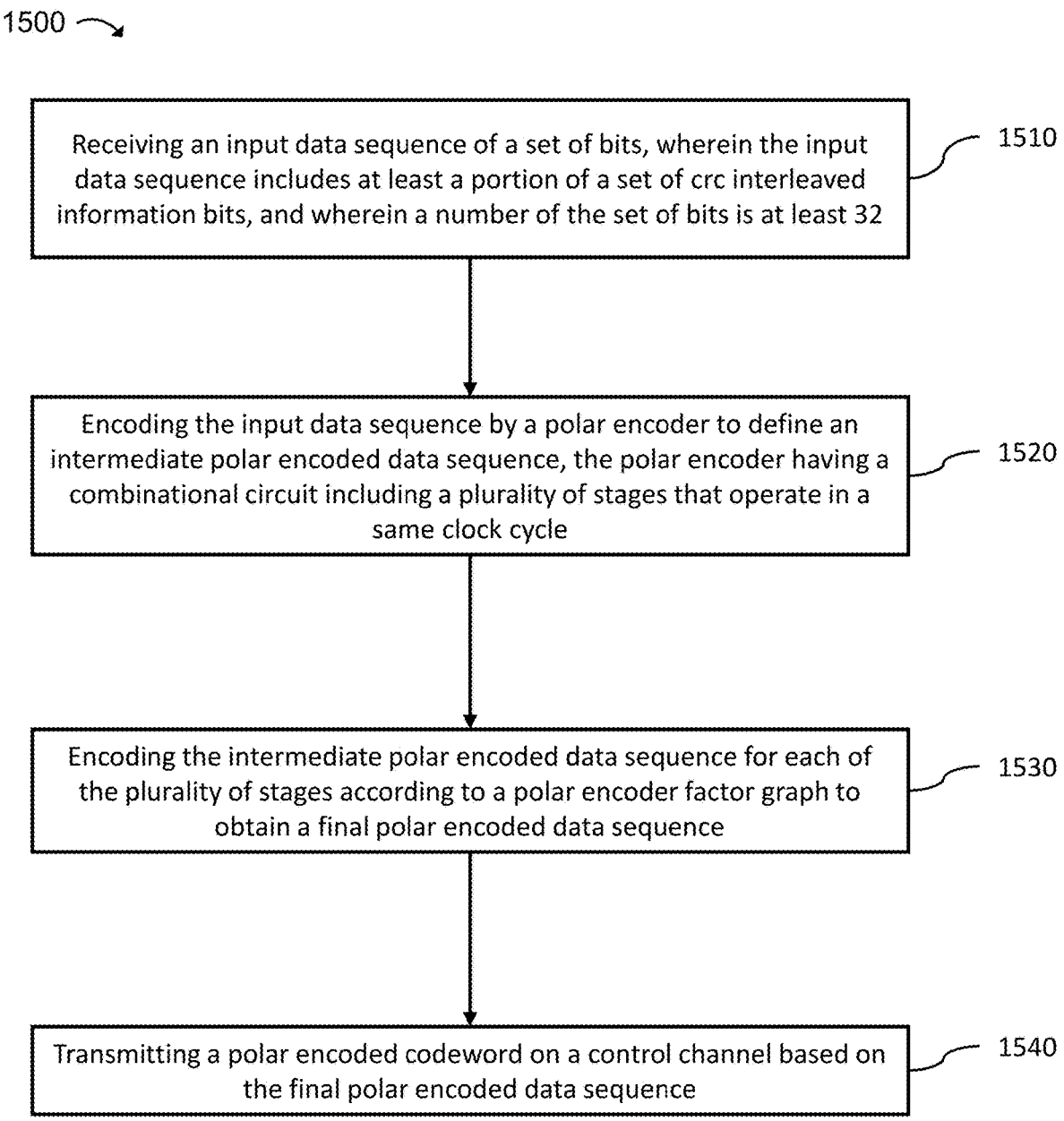
FIG. 15 is a flowchart of an example method for polar encoding for wireless communications according to some aspects of the present disclosure.

FIG. 15 is a flowchart of an example method 1500 for polar encoding for wireless communications according to some aspects of the present disclosure. The method as described herein with relation to FIG. 15 are based upon the elements discussed relative to FIGS. 1, 2, 3, 6, 7, 8A, 8B, 8C, 9, 10 and 13, as described above. In one implementation, for instance, method 1500 is performed by one or more digital processing units 1308 executing instructions to perform the actions of the polar coding block of FIG. 3, and as described in the related figures, wherein such instructions may be stored in one or more memories 1310. In another implementation, for instance, method 1500 is performed by a wireless communication device, such as RF device 1300, implementing at least the polar coding block of FIG. 3, and as described in the related figures, based on execution of corresponding instructions in one or more memories 1310 by one or more digital processing units 1308.

At step 1510, method 1500 includes receiving an input data sequence of a set of bits, wherein the input data sequence includes at least a portion of a set of CRC interleaved information bits, and wherein a number of the set of bits is at least 32. At step 1520, method 1500 includes encoding the input data sequence by a polar encoder to define an intermediate polar encoded data sequence, the polar encoder having a combinational circuit including a plurality of stages that operate in a same clock cycle. At step 1530, method 1500 includes encoding the intermediate polar encoded data sequence for each of the plurality of stages according to a polar encoder factor graph to obtain a final polar encoded data sequence. At step 1540, method 1500 includes transmitting a polar encoded codeword on a control channel based on the final polar encoded data sequence.

In an alternative or additional aspect of method 1500, the polar encoder comprises a radix-k processing architecture, where k is the number of the set of bits of the input data sequence used in processing elements.

In an alternative or additional aspect of method 1500, the polar encoder uses a polar transformation matrix of N, where N is a number of bits of the polar encoded codeword.

In an alternative or additional aspect of method 1500, each of the plurality of stages includes one or more groups, wherein encoding the intermediate polar encoded data sequence for each of the plurality of stages further comprises: writing a first set of input data based on the intermediate polar encoded data sequence to a first memory, wherein the first set of input data each have an odd index; writing a second set of input data based on the intermediate polar encoded data sequence to a second memory, wherein the second set of input data each have an even index; performing, for each of the plurality of stages and based on the first set of input data and the second set of input data and at least one counter value, stage-specific operations including: reading, by each XOR-PASS module in an respective group in a respective stage, a respective stage-specific and group-specific set of input data from the first memory and second memory; performing XOR-PASS operations on the respective stage-specific and group-specific set of input data; and writing a respective stage-specific and group-specific set of output data to the first memory and second memory.

In an alternative or additional aspect of method 1500, writing the respective stage-specific and group-specific set of output data to the first memory and second memory is based on where each of the respective stage-specific and group-specific set of output data is used as input data in a subsequent stage.

In an alternative or additional aspect, method 1500 further comprising tracking, by a control unit and for each of the plurality of stages, respective values of the at least one counter value to track a respective group number, a respective stage number, and a respective number of XOR-PASS modules per stage.

In an alternative or additional aspect of method 1500, the set of CRC interleaved information bits are based on downlink control information.

In an alternative or additional aspect of method 1500, the control channel further comprises a physical downlink control channel.

Figure 16:
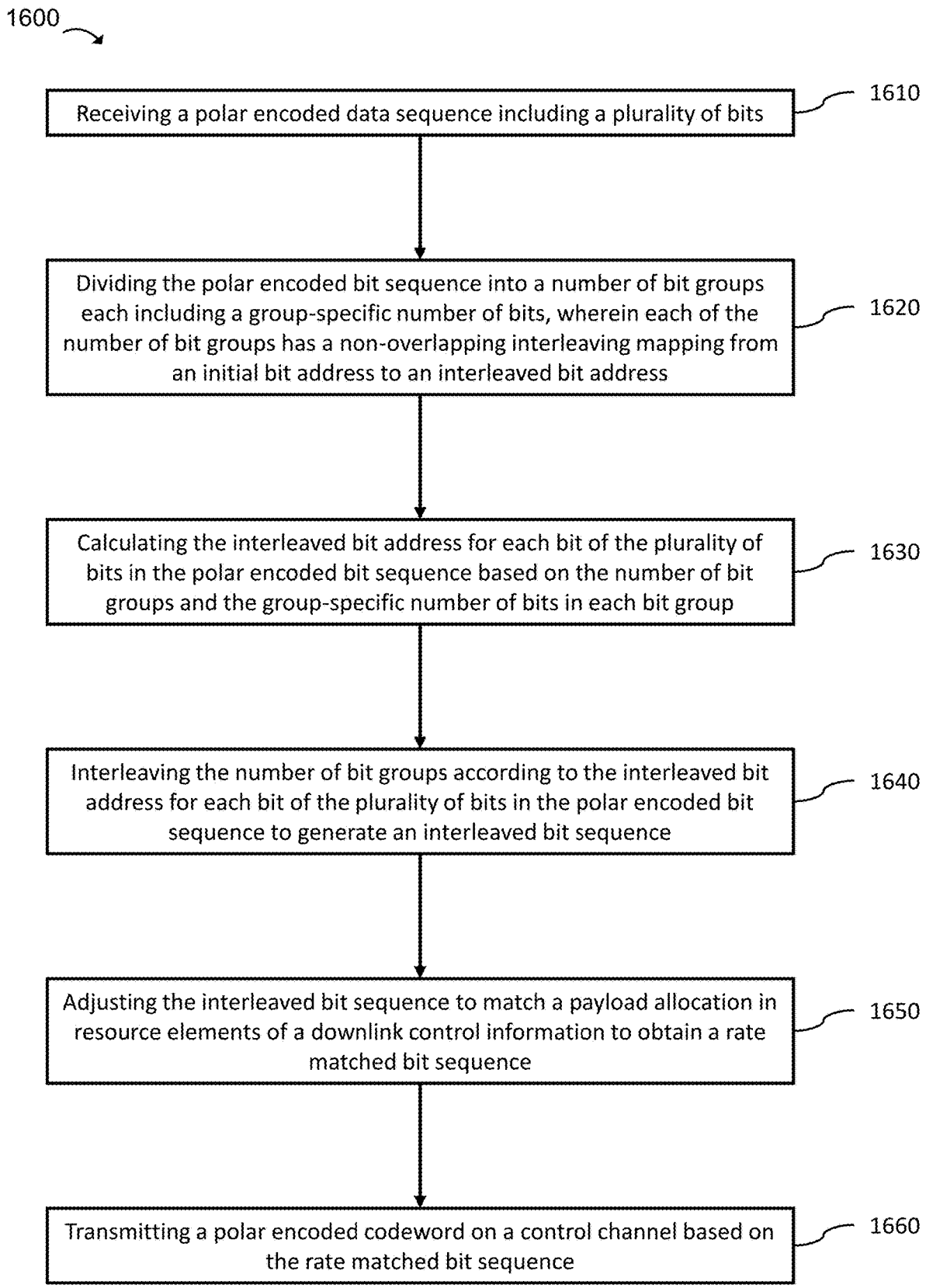
FIG. 16 is a flowchart of an example method for rate matching for wireless communications according to some aspects of the present disclosure.

FIG. 16 is a flowchart of an example method 1600 for rate matching for wireless communications according to some aspects of the present disclosure. The method as described herein with relation to FIG. 16 are based upon the elements discussed relative to FIGS. 1, 2, 3, 11A, 11B, 12 and 13, as described above. In one implementation, for instance, method 1600 is performed by one or more digital processing units 1308 executing instructions to perform the actions of the rate matching block of FIG. 3, and as described in the related figures, wherein such instructions may be stored in one or more memories 1310. In another implementation, for instance, method 1600 is performed by a wireless communication device, such as RF device 1300, implementing at least the rate matching block of FIG. 3, and as described in the related figures, based on execution of corresponding instructions in one or more memories 1310 by one or more digital processing units 1308.

At step 1610, method 1600 includes receiving a polar encoded data sequence including a plurality of bits. At step 1620, method 1600 includes dividing the polar encoded bit sequence into a number of bit groups each including a group-specific number of bits, wherein each of the number of bit groups has a non-overlapping interleaving mapping from an initial bit address to an interleaved bit address. At step 1630, method 1600 includes calculating the interleaved bit address for each bit of the plurality of bits in the polar encoded bit sequence based on the number of bit groups and the group-specific number of bits in each bit group. At step 1640, method 1600 includes interleaving the number of bit groups according to the interleaved bit address for each bit of the plurality of bits in the polar encoded bit sequence to generate an interleaved bit sequence. At step 1650, method 1600 includes adjusting the interleaved bit sequence to match a payload allocation in resource elements of a downlink control information to obtain a rate matched bit sequence. At step 1660, method 1600 includes transmitting a polar encoded codeword on a control channel based on the rate matched bit sequence.

In an alternative or additional aspect of method 1600, dividing the polar encoded bit sequence into the number of bit groups further comprises determining the number of bit groups based on a bit length of downlink control information associated with the polar encoded data sequence.

In an alternative or additional aspect of method 1600, calculating the interleaved bit address for each bit is performed in parallel for each of the number of bit groups.

In an alternative or additional aspect of method 1600, adjusting the interleaved bit sequence includes at least one of repetition, puncturing, or shortening the interleaved bit sequence.

In an alternative or additional aspect of method 1600, the repetition is applied to the interleaved bit sequence when a length of the interleaved bit sequence is greater than or equal to the polar encoded bit sequence.

In an alternative or additional aspect of method 1600, the puncturing or the shortening is applied to the interleaved bit sequence when a length of the interleaved bit sequence is <the polar encoded bit sequence.

In an alternative or additional aspect of method 1600, the interleaved bit sequence includes X*32 bits, where X a natural number greater than or equal to 1.

In an alternative or additional aspect of method 1600, the polar encoded data sequence is based on downlink control information.

In an alternative or additional aspect of method 1600, the control channel further comprises a physical downlink control channel.

While aspects of the present disclosure were described above with references to example of a implementations as shown in the FIGURES, a person skilled in the art will realize that the various teachings described above are applicable to a large variety of other implementations.

In certain contexts, the features discussed herein can be applicable to automotive systems, safety-critical industrial applications, medical systems, scientific instrumentation, wireless and wired communications, radio, radar, industrial process control, audio and video equipment, current sensing, instrumentation (which can be highly precise), and other digital-processing-based systems.

In the discussions of the aspects above, components of a system and/or other components can readily be replaced, substituted, or otherwise modified in order to accommodate particular circuitry needs. Moreover, it may be noted that the use of complementary electronic devices, hardware, software, etc., offer an equally viable option for implementing the teachings of the present disclosure related to CRC interleaving (e.g., for 5G PDCCH), in various communication systems.

Parts of various systems for implementing CRC interleaving (e.g., for 5G PDCCH) as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example aspect, any number of electrical circuits of the present FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various aspects, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example aspect, the electrical circuits of the present figures may be implemented as stand-alone modules (e.g., a device with associated components and circuitry configured to perform a specific application or function) or implemented as plug-in modules into application specific hardware of electronic devices. Note that particular aspects of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other aspects may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components of the apparatuses and/or RF device shown in the FIGURES) have been offered for purposes of example and teaching. Such information may be varied considerably without departing from the spirit of the present disclosure, or the scope of the appended claims. It may be appreciated that the system can be consolidated in any suitable manner. Along similar design alternatives, any of the illustrated circuits, components, modules, and elements of the present FIGURES may be combined in various possible configurations, all of which are clearly within the broad scope of this specification. In the foregoing description, example aspects have been described with reference to particular processor and/or component arrangements. Various modifications and changes may be made to such aspects without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It may be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by referencing a limited number of electrical elements. It may be appreciated that the electrical circuits of the FIGURES and its teachings are readily scalable and can accommodate a large number of components, as well as more complicated/sophisticated arrangements and configurations. Accordingly, the examples provided may not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one aspect", "example aspect", "an aspect", "another aspect", "some aspects", "various aspects", "other aspects", "alternative aspect", and the like are intended to mean that any such features are included in one or more aspects of the present disclosure, but may or may not necessarily be combined in the same aspects. Also, as used herein, including in the claims, "or" as used in a list of items (for example, a list of items prefaced by a phrase such as "at least one of" or "one or more of") indicates an inclusive list such that, for example, a list of [at least one of A, B, or C] means A or B or C or AB or AC or BC or ABC (i.e., A and B and C).

Various aspects of the illustrative aspects are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Also, as used herein, the terms "substantially," "approximately," "about," etc., may be used to generally refer to being within +/−20% of a target value, e.g., within +/−10% of a target value, based on the context of a particular value as described herein or as known in the art.

Numerous other changes, substitutions, variations, alterations, and modifications may be ascertained to one skilled in the art and it is intended that the present disclosure encompass all such changes, substitutions, variations, alterations, and modifications as falling within the scope of the examples and appended claims. Note that all optional features of the apparatus described above may also be implemented with respect to the method or process described herein and specifics in the examples may be used anywhere in one or more aspects.

Additionally, the described aspects may include one or any combination of the following clauses.

Clause 1. A method of wireless communications, comprising: receiving, at a cyclic redundancy check (CRC) interleaver, a set of information bits in a message register; prepending the set of information bits with a first set of NULL bits to define a set of prepended message bits; receiving a set of valid bits in a mask register; prepending the set of valid bits with a second set of NULL bits to define a set of prepended mask bits; interleaving the set of prepended message bits according to an interleaving pattern to define a set of interleaved message bits; interleaving the set of prepended mask bits according to the interleaving pattern to define a set of interleaved mask bits; dividing the set of interleaved message bits and the set of interleaved mask bits into respective ones of a set of bit groups each with a same number of interleaved message bits and interleaved mask bits such that each set of bit groups includes a set of divided interleaved message bit groups and a set of divided interleaved mask bit groups; selecting valid bits from the set of divided interleaved message bit groups based on the set of divided interleaved mask bit groups for each of the set of bit groups; combining the valid bits to obtain a set of CRC interleaved information bits; and transmitting a polar encoded codeword on a control channel based on the set of CRC interleaved information bits.

Clause 2. The method of clause 1, wherein the set information bits comprise downlink control information bits and CRC bits.

Clause 3. The method of any clause 1-2, wherein the control channel further comprises a physical downlink control channel.

Clause 4. The method of any clause 1-3, wherein the dividing of the set of interleaved message bits and the dividing of the set of interleaved mask bits is performed in parallel.

Clause 5. The method of any clause 1-4, wherein the selecting of the valid bits is performed in parallel by a plurality of multiplexers, including inputting corresponding ones of the set of divided interleaved message bit groups and set of divided interleaved mask bit groups into each of the plurality of multiplexers, and using mask bits from each of the set of divided interleaved mask bit groups by each of the plurality of multiplexers as a selector to select respective ones of the valid bits.

Clause 6. The method of any clause 1-5, wherein combining the valid bits to obtain the set of CRC interleaved information bits further comprises: dividing the valid bits into a plurality of blocks of valid bits; performing, in parallel, on each of the plurality of blocks of valid bits: identifying a first set of valid bits based on a counter; and selecting a second set of valid bits from the first set of valid bits based on a number of valid bits in a respective block of the plurality of valid bits; and combining each second set of valid bits of the plurality of blocks of valid bits to obtain the set of CRC interleaved information bits.

Clause 7. The method of any clause 1-6, wherein a number of each of the set of information bits and the set of valid bits is >0 and less than 164, and the message register and the mask register each have a 164 bit length.

Clause 8. The method of any clause 1-7, wherein each of the first set of NULL bits and the second set of NULL bits are zeros, and a number of NULL bits in each of the first set of NULL bits and the second set of NULL bits is equal to 164-K, wherein K>0.

Clause 9. The method of any clause 1-8, wherein the valid bits are ones.

Clause 10. The method of any clause 1-9, wherein the same number of interleaved message bits and interleaved mask bits in each of the set of bit groups is 5, wherein selecting the valid bits comprises selecting by a 32 bit multiplexer.

Clause 11. An apparatus for wireless communications, comprising: one or more memories; and one or more processors coupled with the one or more memories and configured, individually or in combination, to: receive, at a cyclic redundancy check (CRC) interleaver, a set of information bits in a message register; prepend the set of information bits with a first set of NULL bits to define a set of prepended message bits; receive a set of valid bits in a mask register; prepend the set of valid bits with a second set of NULL bits to define a set of prepended mask bits; interleave the set of prepended message bits according to an interleaving pattern to define a set of interleaved message bits; interleave the set of prepended mask bits according to the interleaving pattern to define a set of interleaved mask bits; divide the set of interleaved message bits and the set of interleaved mask bits into respective ones of a set of bit groups each with a same number of interleaved message bits and interleaved mask bits such that each set of bit groups includes a set of divided interleaved message bit groups and a set of divided interleaved mask bit groups; select valid bits from the set of divided interleaved message bit groups based on the set of divided interleaved mask bit groups for each of the set of bit groups; combine the valid bits to obtain a set of CRC interleaved information bits; and transmit a polar encoded codeword on a control channel based on the set of CRC interleaved information bits.

Clause 12. The apparatus of clause 11, wherein the set of information bits comprise downlink control information bits and CRC bits.

Clause 13. The apparatus of any clause 11-12, wherein the control channel comprises a physical downlink control channel.

Clause 14. The apparatus of any clause 11-13, wherein the one or more processors are configured to divide the set of interleaved message bits and to divide the set of interleaved mask bits in parallel.

Clause 15. The apparatus of any clause 11-14, wherein the one or more processors include a plurality of multiplexers to select the valid bits in parallel, wherein the plurality of multiplexers are configured to input corresponding ones of the set of divided interleaved message bit groups and set of divided interleaved mask bit groups, and to use mask bits from each of the set of divided interleaved mask bit groups as a selector to select respective ones of the valid bits.

Clause 16. The apparatus of any clause 11-15, wherein to combine the valid bits to obtain the set of CRC interleaved information bits the processor is further configured to: divide the valid bits into a plurality of blocks of valid bits; perform, in parallel, on each of the plurality of blocks of valid bits: identification of a first set of valid bits based on a counter; and selection of a second set of valid bits from the first set of valid bits based on a number of valid bits in a respective block of the plurality of valid bits; and combine each second set of valid bits of the plurality of blocks of valid bits to obtain the set of CRC interleaved information bits.

Clause 17. The apparatus of any clause 11-16, wherein a number of each of the set of information bits and the set of valid bits is >0 and less than 164, and the message register and the mask register each have a 164 bit length.

Clause 18. The apparatus of any clause 11-17, wherein each of the first set of NULL bits and the second set of NULL bits are zeros, and a number of NULL bits in each of the first set of NULL bits and the second set of NULL bits is equal to 164-K, wherein K>0.

Clause 19. The apparatus of any clause 11-18, wherein the valid bits are ones.

Clause 20. The apparatus of any clause 11-19, wherein the same number of interleaved message bits and interleaved mask bits in each of the set of bit groups is 5, wherein to select the valid bits comprises to select by a 32 bit multiplexer.

Clause 21. A computer-readable medium comprising stored instructions for wireless communications, wherein the instructions are executable by one or more processors to perform the method of any of clauses 1-10.

Clause 22. A method of wireless communications, comprising: receiving an input data sequence of a set of bits, wherein the input data sequence includes at least a portion of a set of CRC interleaved information bits, and wherein a number of the set of bits is at least 32; encoding the input data sequence by a polar encoder to define an intermediate polar encoded data sequence, the polar encoder having a combinational circuit including a plurality of stages that operate in a same clock cycle; encoding the intermediate polar encoded data sequence for each of the plurality of stages according to a polar encoder factor graph to obtain a final polar encoded data sequence; and transmitting a polar encoded codeword on a control channel based on the final polar encoded data sequence.

Clause 23. The method of clause 22, wherein the polar encoder comprises a radix-k processing architecture, where k is the number of the set of bits of the input data sequence used in processing elements.

Clause 24. The method of any clause 22-23, wherein the polar encoder uses a polar transformation matrix of N, where N is a number of bits of the polar encoded codeword.

Clause 25. The method of any clause 22-24, wherein each of the plurality of stages includes one or more groups, wherein encoding the intermediate polar encoded data sequence for each of the plurality of stages further comprises: writing a first set of input data based on the intermediate polar encoded data sequence to a first memory, wherein the first set of input data each have an odd index; writing a second set of input data based on the intermediate polar encoded data sequence to a second memory, wherein the second set of input data each have an even index; performing, for each of the plurality of stages and based on the first set of input data and the second set of input data and at least one counter value, stage-specific operations including: reading, by each XOR-PASS module in an respective group in a respective stage, a respective stage-specific and group-specific set of input data from the first memory and second memory; performing XOR-PASS operations on the respective stage-specific and group-specific set of input data; and writing a respective stage-specific and group-specific set of output data to the first memory and second memory.

Clause 26. The method of any clause 22-25, wherein writing the respective stage-specific and group-specific set of output data to the first memory and second memory is based on where each of the respective stage-specific and group-specific set of output data is used as input data in a subsequent stage.

Clause 27. The method of any clause 22-26, further comprising tracking, by a control unit and for each of the plurality of stages, respective values of the at least one counter value to track a respective group number, a respective stage number, and a respective number of XOR-PASS modules per stage.

Clause 28. The method of any clause 22-27, wherein the set of CRC interleaved information bits are based on downlink control information.

Clause 29. The method of any clause 22-29, wherein the control channel further comprises a physical downlink control channel.

Clause 30. An apparatus for wireless communications, comprising: one or more memories; and one or more processors coupled with the one or more memories and configured, individually or in combination, to: receive an input data sequence of a set of bits, wherein the input data sequence includes at least a portion of a set of CRC interleaved information bits, and wherein a number of the set of bits is at least 32; encode the input data sequence by a polar encoder to define an intermediate polar encoded data sequence, the polar encoder having a combinational circuit including a plurality of stages that operate in a same clock cycle; encode the intermediate polar encoded data sequence for each of the plurality of stages according to a polar encoder factor graph to obtain a final polar encoded data sequence; and transmit a polar encoded codeword on a control channel based on the final polar encoded data sequence.

Clause 31. The apparatus of clause 30, wherein the polar encoder comprises a radix-k processing architecture, where k is the number of the set of bits of the input data sequence used in processing elements.

Clause 32. The apparatus of any clause 30-31, wherein the polar encoder uses a polar transformation matrix of N, where N is a number of bits of the polar encoded codeword.

Clause 33. The apparatus of any clause 30-32, wherein each of the plurality of stages includes one or more groups, wherein to encode the intermediate polar encoded data sequence for each of the plurality of stages the one or more processors are further configured to: write a first set of input data based on the intermediate polar encoded data sequence to a first memory, wherein the first set of input data each have an odd index; write a second set of input data based on the intermediate polar encoded data sequence to a second memory, wherein the second set of input data each have an even index; perform, for each of the plurality of stages and based on the first set of input data and the second set of input data and at least one counter value, stage-specific operations including: read, by each XOR-PASS module in an respective group in a respective stage, a respective stage-specific and group-specific set of input data from the first memory and second memory; perform XOR-PASS operations on the respective stage-specific and group-specific set of input data;

and write a respective stage-specific and group-specific set of output data to the first memory and second memory.

Clause 34. The apparatus of any clause 30-33, wherein to write the respective stage-specific and group-specific set of output data to the first memory and second memory is based on where each of the respective stage-specific and group-specific set of output data is used as input data in a subsequent stage.

Clause 35. The apparatus of any clause 30-34, wherein the one or more processors are further configured to track, using a control unit and for each of the plurality of stages, respective values of the at least one counter value to track a respective group number, a respective stage number, and a respective number of XOR-PASS modules per stage.

Clause 36. The apparatus of any clause 30-35, wherein the set of CRC interleaved information bits are based on downlink control information.

Clause 37. The apparatus of any clause 30-36, wherein the control channel the processor is further configured to a physical downlink control channel.

Clause 38. A computer-readable medium comprising stored instructions for wireless communications, wherein the instructions are executable by one or more processors to perform the method of any of clauses 22-29.

Clause 39. A method of wireless communications, comprising: receiving a polar encoded data sequence including a plurality of bits; dividing the polar encoded bit sequence into a number of bit groups each including a group-specific number of bits, wherein each of the number of bit groups has a non-overlapping interleaving mapping from an initial bit address to an interleaved bit address; calculating the interleaved bit address for each bit of the plurality of bits in the polar encoded bit sequence based on the number of bit groups and the group-specific number of bits in each bit group; interleaving the number of bit groups according to the interleaved bit address for each bit of the plurality of bits in the polar encoded bit sequence to generate an interleaved bit sequence; adjusting the interleaved bit sequence to match a payload allocation in resource elements of a downlink control information to obtain a rate matched bit sequence; and transmitting a polar encoded codeword on a control channel based on the rate matched bit sequence.

Clause 40. The method of clause 39, wherein dividing the polar encoded bit sequence into the number of bit groups further comprises determining the number of bit groups based on a bit length of downlink control information associated with the polar encoded data sequence.

Clause 41. The method of any clause 39-40, wherein calculating the interleaved bit address for each bit is performed in parallel for each of the number of bit groups.

Clause 42. The method of any clause 39-41, wherein adjusting the interleaved bit sequence includes at least one of repetition, puncturing, or shortening the interleaved bit sequence.

Clause 43. The method of any clause 39-42, wherein the repetition is applied to the interleaved bit sequence when a length of the interleaved bit sequence is greater than or equal to the polar encoded bit sequence.

Clause 44. The method of any clause 39-43, wherein the puncturing or the shortening is applied to the interleaved bit sequence when a length of the interleaved bit sequence is <the polar encoded bit sequence.

Clause 45. The method of any clause 39-44, wherein the interleaved bit sequence includes X*32 bits, where X a natural number greater than or equal to 1.

Clause 46. The method of any clause 39-45, wherein the polar encoded data sequence is based on downlink control information.

Clause 47. The method of any clause 39-46, wherein the control channel further comprises a physical downlink control channel.

Clause 48. An apparatus for wireless communications, comprising: one or more memories; and one or more processors coupled with the one or more memories and configured, individually or in combination, to: receive a polar encoded data sequence including a plurality of bits; divide the polar encoded bit sequence into a number of bit groups each including a group-specific number of bits, wherein each of the number of bit groups has a non-overlapping interleaving mapping from an initial bit address to an interleaved bit address; calculate the interleaved bit address for each bit of the plurality of bits in the polar encoded bit sequence based on the number of bit groups and the group-specific number of bits in each bit group; interleave the number of bit groups according to the interleaved bit address for each bit of the plurality of bits in the polar encoded bit sequence to generate an interleaved bit sequence; adjust the interleaved bit sequence to match a payload allocation in resource elements of a downlink control information to obtain a rate matched bit sequence; and transmit a polar encoded codeword on a control channel based on the rate matched bit sequence.

Clause 49. The apparatus of clause 48, wherein to divide the polar encoded bit sequence into the number of bit groups the one or more processors are further configured to determine the number of bit groups based on a bit length of downlink control information associated with the polar encoded data sequence.

Clause 50. The apparatus of any clause 48-49, wherein to calculate the interleaved bit address for each bit is performed in parallel for each of the number of bit groups.

Clause 51. The apparatus of any clause 48-50, wherein to adjust the interleaved bit sequence includes at least one of repetition, puncturing, or shortening the interleaved bit sequence.

Clause 52. The apparatus of any clause 48-51, wherein the repetition is applied to the interleaved bit sequence when a length of the interleaved bit sequence is greater than or equal to the polar encoded bit sequence.

Clause 53. The apparatus of any clause 48-52, wherein the puncturing or the shortening is applied to the interleaved bit sequence when a length of the interleaved bit sequence is <the polar encoded bit sequence.

Clause 54. The apparatus of any clause 48-53, wherein the interleaved bit sequence includes X*32 bits, where X a natural number greater than or equal to 1.

Clause 55. The apparatus of any clause 48-54, wherein the polar encoded data sequence is based on downlink control information.

Clause 56. The apparatus of any clause 48-55, wherein the control channel the processor is further configured to a physical downlink control channel.

Clause 57. A computer-readable medium comprising stored instructions for wireless communications, wherein the instructions are executable by one or more processors, individually or in combination, to perform the method of any of clauses 39-47.

A method of wireless communications comprising any of clauses 1-10, 22-29, and 39-47.

An apparatus for wireless communications including one or more memories coupled with one or more processors that are configured, individually or in any combination, to perform the method of any of clauses 1-10, 22-29, and 39-47.

An apparatus for wireless communications including one or more means for performing the method of any of clauses 1-10, 22-29, and 39-47.

A computer-readable medium having stored thereon instructions for wireless communications, wherein the instructions are executable by one or more processors that are configured, individually or in any combination, to perform the method of any of clauses 1-10, 22-29, and 39-47.

What is claimed is:

1. A method of wireless communications, comprising:
   receiving an input data sequence of a set of bits, wherein the input data sequence includes at least a portion of a set of CRC interleaved information bits, and wherein a number of the set of bits is at least 32;
   encoding the input data sequence by a polar encoder to define an intermediate polar encoded data sequence, the polar encoder having a combinational circuit including a plurality of stages that operate in a same clock cycle;
   encoding the intermediate polar encoded data sequence for each of the plurality of stages according to a polar encoder factor graph to obtain a final polar encoded data sequence; and
   transmitting a polar encoded codeword on a control channel based on the final polar encoded data sequence.

2. The method of claim 1, wherein the polar encoder comprises a radix-k processing architecture, where k is the number of the set of bits of the input data sequence used in processing elements.

3. The method of claim 1, wherein the polar encoder uses a polar transformation matrix of N, where N is a number of bits of the polar encoded codeword.

4. The method of claim 1, wherein each of the plurality of stages includes one or more groups, wherein encoding the intermediate polar encoded data sequence for each of the plurality of stages further comprises:
   writing a first set of input data based on the intermediate polar encoded data sequence to a first memory, wherein the first set of input data each have an odd index;
   writing a second set of input data based on the intermediate polar encoded data sequence to a second memory, wherein the second set of input data each have an even index;
   performing, for each of the plurality of stages and based on the first set of input data and the second set of input data and at least one counter value, stage-specific operations including:
      reading, by each XOR-PASS module in an respective group in a respective stage, a respective stage-specific and group-specific set of input data from the first memory and second memory;
      performing XOR-PASS operations on the respective stage-specific and group-specific set of input data; and
      writing a respective stage-specific and group-specific set of output data to the first memory and second memory.

5. The method of claim 4, wherein writing the respective stage-specific and group-specific set of output data to the first memory and second memory is based on where each of the respective stage-specific and group-specific set of output data is used as input data in a subsequent stage.

6. The method of claim 4, further comprising tracking, by a control unit and for each of the plurality of stages, respective values of the at least one counter value to track a respective group number, a respective stage number, and a respective number of XOR-PASS modules per stage.

7. The method of claim 1, wherein the set of CRC interleaved information bits are based on downlink control information.

8. The method of claim 1, wherein the control channel further comprises a physical downlink control channel.

9. An apparatus for wireless communications, comprising:
   one or more memories; and
   one or more processors coupled with the one or more memories and configured, individually or in combination, to:
      receive an input data sequence of a set of bits, wherein the input data sequence includes at least a portion of a set of CRC interleaved information bits, and wherein a number of the set of bits is at least 32;
      encode the input data sequence by a polar encoder to define an intermediate polar encoded data sequence, the polar encoder having a combinational circuit including a plurality of stages that operate in a same clock cycle;
      encode the intermediate polar encoded data sequence for each of the plurality of stages according to a polar encoder factor graph to obtain a final polar encoded data sequence; and
      transmit a polar encoded codeword on a control channel based on the final polar encoded data sequence.

10. The apparatus of claim 9, wherein the polar encoder comprises a radix-k processing architecture, where k is the number of the set of bits of the input data sequence used in processing elements.

11. The apparatus of claim 9, wherein the polar encoder uses a polar transformation matrix of N, where N is a number of bits of the polar encoded codeword.

12. The apparatus of claim 9, wherein each of the plurality of stages includes one or more groups, wherein to encode the intermediate polar encoded data sequence for each of the plurality of stages the one or more processors are further configured to:
   write a first set of input data based on the intermediate polar encoded data sequence to a first memory, wherein the first set of input data each have an odd index;
   write a second set of input data based on the intermediate polar encoded data sequence to a second memory, wherein the second set of input data each have an even index;
   perform, for each of the plurality of stages and based on the first set of input data and the second set of input data and at least one counter value, stage-specific operations including:
      read, by each XOR-PASS module in an respective group in a respective stage, a respective stage-specific and group-specific set of input data from the first memory and second memory;
      perform XOR-PASS operations on the respective stage-specific and group-specific set of input data; and
      write a respective stage-specific and group-specific set of output data to the first memory and second memory.

13. The apparatus of claim 12, wherein to write the respective stage-specific and group-specific set of output data to the first memory and second memory is based on where each of the respective stage-specific and group-specific set of output data is used as input data in a subsequent stage.

14. The apparatus of claim 12, wherein the one or more processors are further configured to track, using a control unit and for each of the plurality of stages, respective values of the at least one counter value to track a respective group number, a respective stage number, and a respective number of XOR-PASS modules per stage.

15. The apparatus of claim 9, wherein the set of CRC interleaved information bits are based on downlink control information.

16. The apparatus of claim 9, wherein the control channel the processor is further configured to a physical downlink control channel.

17. A computer-readable medium comprising stored instructions for wireless communications, wherein the instructions are executable by one or more processors to:
 receive an input data sequence of a set of bits, wherein the input data sequence includes at least a portion of a set of CRC interleaved information bits, and wherein a number of the set of bits is at least 32;
 encode the input data sequence by a polar encoder to define an intermediate polar encoded data sequence, the polar encoder having a combinational circuit including a plurality of stages that operate in a same clock cycle;
 encode the intermediate polar encoded data sequence for each of the plurality of stages according to a polar encoder factor graph to obtain a final polar encoded data sequence; and
 transmit a polar encoded codeword on a control channel based on the final polar encoded data sequence.

\* \* \* \* \*